(12) United States Patent
Maeda et al.

(10) Patent No.: US 7,541,874 B2
(45) Date of Patent: Jun. 2, 2009

(54) HIGH-FREQUENCY POWER AMPLIFIER DEVICE

(75) Inventors: Masahiro Maeda, Osaka (JP);
Katsuhiko Kawashima, Hyogo (JP);
Masatoshi Kamitani, Osaka (JP)

(73) Assignee: Panasonic Corporation, Osaka (JP)

( * ) Notice: Subject to any disclaimer, the term of this patent is extended or adjusted under 35 U.S.C. 154(b) by 58 days.

(21) Appl. No.: 11/727,692

(22) Filed: Mar. 28, 2007

(65) Prior Publication Data

US 2007/0229170 A1 Oct. 4, 2007

(30) Foreign Application Priority Data

Mar. 29, 2006 (JP) .............................. 2006-091207

(51) Int. Cl.
*H03F 3/04* (2006.01)
(52) U.S. Cl. ....................................... 330/302; 330/296
(58) Field of Classification Search ................. 330/302, 330/285, 296, 310, 150, 98
See application file for complete search history.

(56) References Cited

U.S. PATENT DOCUMENTS

| | | | | |
|---|---|---|---|---|
| 4,839,612 A | * | 6/1989 | Akagi ........................ 330/302 |
| 5,117,203 A | * | 5/1992 | Tennyson .................... 330/294 |
| 5,942,943 A | * | 8/1999 | Matsuno ...................... 330/277 |
| 5,960,334 A | * | 9/1999 | Nakano ..................... 455/188.1 |
| 6,104,247 A | * | 8/2000 | Ha .............................. 330/295 |
| 6,437,649 B2 | * | 8/2002 | Miyashita et al. ........... 330/302 |
| 6,441,689 B1 | * | 8/2002 | Joseph ........................ 330/302 |
| 6,614,311 B2 | * | 9/2003 | Takenaka .................... 330/302 |
| 7,170,353 B2 | * | 1/2007 | Amano ....................... 330/295 |

FOREIGN PATENT DOCUMENTS

JP        11-266130 A        9/1999

* cited by examiner

*Primary Examiner*—Henry K Choe
(74) *Attorney, Agent, or Firm*—McDermott Will & Emery LLP

(57) ABSTRACT

A high-frequency power amplifier device including: a power amplifier circuit which amplifies a high-frequency signal; an output matching circuit connected to an output side of the power amplifier circuit; and a high-frequency circuit connected to an output side of the output matching circuit, which is designed so that X[f] satisfies the relationship expressed as X[L]<X[H], where j denotes an imaginary number, f denotes a frequency, an impedance of the high-frequency circuit viewed from the output matching circuit is defined as Z[f]=R[f]+jX[f], L denotes a lower limit of the frequency, and H denotes an upper limit of the frequency.

16 Claims, 27 Drawing Sheets

Prior Art

FIG. 3

| Item | Unit | Value | | |
|---|---|---|---|---|
| Frequency | MHz | 1940 | 1950 | 1960 |
| ZL(PA) | Ω | 50 | 50 | 50 |
| ZL(TR) | Ω | 5.1-j0.5 | 5 | 4.9-j0.5 |
| VSWR in terminal 126 | | 1.1 or below | | |
| ACPR | dBc | -42 | -42 | -42 |
| Efficiency | % | 45 | 45 | 45 |
| Performance judgment | | ◎ | ◎ | ◎ |

Prior Art

Prior Art

FIG. 5

| Item | Unit | Value | | |
|---|---|---|---|---|
| Frequency | MHz | 1750 | 1850 | 1960 |
| ZL(PA) | Ω | 50 | 50 | 50 |
| ZL(TR) | Ω | 5.6-j1.6 | 5 | 4.6+j1.6 |
| VSWR in terminal 126 | | 1.5 or below | | |
| ACPR | dBc | -39 | -42 | -37 |
| Efficiency | % | 40 | 45 | 43 |
| Performance judgment | | × | ◎ | × |

Prior Art

Prior Art

Prior Art

FIG. 9

| Item | Unit | Value | | |
|---|---|---|---|---|
| Frequency | MHz | 1750 | 1850 | 1960 |
| ZL(PA) | Ω | 49+j7.8 | 50 | 49-j7.9 |
| ZL(TR) | Ω | 6.2-j2.4 | 5 | 4.2+j2.2 |
| VSWR in terminal 126 | | 1.5 or below | | |
| ACPR | dBc | -37 | -42 | -35 |
| Efficiency | % | 38 | 45 | 42 |
| Performance judgment | | xx | ◎ | xx |

Prior Art

FIG. 14

| Item | Unit | Value | | |
|---|---|---|---|---|
| Frequency | MHz | 1750 | 1850 | 1960 |
| ZL(PA) | Ω | 46.5-j7 | 50 | 52+j8.3 |
| ZL(TR) | Ω | 5.3-j0.8 | 5 | 4.8+j0.8 |
| VSWR in terminal 126 | | 1.2 or below | | |
| ACPR | dBc | -41 | -42 | -39 |
| Efficiency | % | 43 | 45 | 44 |
| Performance judgment | | ○ | ◎ | △ |

FIG. 25

| Item | Unit | Value | | |
|---|---|---|---|---|
| Frequency | MHz | 1750 | 1850 | 1960 |
| ZL(PA) | Ω | 43-j14 | 50 | 54+j16 |
| ZL(TR) | Ω | 5 | 5 | 5 |
| VSWR in terminal 126 | | 1 | | |
| ACPR | dBc | -42 | -42 | -42 |
| Efficiency | % | 45 | 45 | 45 |
| Performance judgment | | ◎ | ◎ | ◎ |

HIGH-FREQUENCY POWER AMPLIFIER DEVICE

BACKGROUND OF THE INVENTION (1) Field of the Invention

The present invention relates to a high-frequency power amplifier device to be used for transmissions carried out by a mobile communication device such as a cell phone.

(2) Description of the Related Art

Recently, high efficiency (in power saving) of transmission power amplifiers which consume a large amount of power as well as the miniaturization of batteries has been regarded important in order to realize small, lightweight cell phones which are able to perform communication for extended periods of time.

The power amplifiers to be used for the transmissions carried out by the cell phones are called power amplifier (PA) modules, and GaAs high-frequency transistors, which have excellent high-frequency characteristics and power efficiency, are mainly used as such modules. The GaAs high-frequency transistors include field-effect transistors (hereinafter referred to as "FETs") and hetero-bipolar transistors (hereinafter referred to as "HBTs").

The following describes a power amplifier that uses HBTs, with reference to the diagrams and using three examples. Note that the description will be given with the same referential marks provided to the same components (e.g. Japanese Laid-Open Patent Application No. 11-266130).

FIG. 1 is a diagram showing the outline of a conventional power amplifier 125 illustrated as a first example. As shown in FIG. 1, the high-frequency power inputted from an input terminal 106 passes through an input matching circuit 103, and then, is inputted in a front stage HBT 101 and amplified by the front stage HBT 101. The input matching circuit 103 is configured of a shunt inductor 107 and a serial condenser 108 in an order closest to the input terminal 106. Here, a shunt inductor is an inductor connected between a signal line and a ground, while a serial condenser is a condenser connected in series to a signal line.

The high-frequency power amplified by the front stage HBT 101 passes through an inter-stage matching circuit 104, and then, is inputted in a rear stage HBT 102 and amplified by the rear stage HBT 102. The inter-stage matching circuit 104 is configured of a shunt condenser 109 and a serial inductor 110 in an order closest to the front stage HBT 101. Here, a shunt condenser is a condenser connected between a signal line and a ground, while a serial inductor is an inductor connected in series to a signal line.

The high-frequency power amplified by the rear stage HBT 102 passes through an output matching circuit 105, and then outputted from an output terminal 116. The output matching circuit 105 is configured of a microstrip line 111, a shunt condenser 112 and a serial condenser 113 in an order closest to the rear stage HBT 102. A characteristic impedance of the microstrip line 111 is designed to be 50Ω and the serial condenser 113 is used to interrupt direct current.

A collector power terminal 117 is connected to a collector of the front stage HBT 101 via a chalk coil 123. The chalk coil 123 is placed to prevent the high-frequency power from leaking to the collector power terminal 117. A front stage bias circuit 121a which functions as a temperature compensation circuit is connected to a base terminal of the front stage HBT 101. Control terminals 119 and 120 are connected to the front stage bias circuit 121a.

Similarly, a collector power terminal 118 is connected to a collector of the rear stage HBT 102 via a chalk coil 124. The chalk coil 124 is placed to prevent the high-frequency power from leaking to the collector power terminal 118. A rear stage bias circuit 121b which functions as a temperature compensation circuit is connected to a base terminal of the rear stage HBT 102. Control terminals 121 and 122 are connected to the rear stage bias circuit 121b.

FIG. 2 is a diagram showing the structure of the conventional power amplifier 125 illustrated as the first example. As shown in FIG. 2, a module substrate 131 is made up of three layers of resin substrates 131a, 131b and 131c. The dielectric constant of the respective substrates is 4.4. On the rear surface of the lowest substrate 131c, the input terminal 106, the output terminal 116, a ground terminal 130, the collector power terminals 117 and 118, and the control terminals 119 to 122 are formed. On the top surface of the top layer substrate 131a, a metal wiring 132 is formed. The input matching circuit 103, the inter-stage matching circuit 104 and the output matching circuit 105 is each formed by the metal wiring 132, a chip condenser 135 and a chip inductor 136. On the lateral surface of a through-hole 137, a metal film is formed, and the metal wiring formed on each of the substrates 131a, 131b and 131c is electrically connected to the metal film when necessary. An HBT chip 133 for which GaAs is used is implemented on a ground electrode 138 formed on the top surface of the top layer substrate 131a. The HBT chip 133 and the metal wiring 132 are electrically connected by a bonding wire 134.

A power amplifier for wide-band CDMA with adjacent channel power ratio (hereinafter referred to as "ACPR") characteristic of −40 dBc or below and power efficiency (hereinafter simply referred to as "efficiency") of 43% or above is required under the conditions such as a frequency of 1940 to 1960 MHz, a power voltage of 3.5V and an output power of 27 dBm. In order to meet such characteristics, it is preferable to set 5Ω for the impedance ZL (TR) viewed from the rear stage HBT 102 in the power amplifier 125. More specifically, the length of the microstrip line 111 may be set to 3.5 mm, the capacity of the shunt condenser 112 to 4.5 pF, and the capacity of the serial condenser 113 to 100 pF.

FIG. 3 is a diagram showing a table listing the characteristics of the power amplifier 125 illustrated as the first example. As shown in FIG. 3, when the impedance ZL (PA) viewed from the output terminal 116 of the power amplifier 125 is set to 50Ω as a terminating resistor, the impedance ZL (TR), as an impedance of the output matching circuit 105 viewed from the output end of the rear stage HBT 102, is 5.1−j0.5Ω, 5Ω, 4.9+j0.5Ω when the frequency is 1940 MHz, 1950 MHz and 1960 MHz respectively. When Z0=5Ω is standardized, a voltage standing wave ratio (hereinafter simply referred to as "VSWR") in the terminal 126 is 1.1 or below in the frequency ranging from 1940 to 1960 MHz. Here, the power amplifier 125 was evaluated under the loaded conditions such as a power voltage of 3.5V and an output power of 27 dBm. As a result, satisfactory characteristics of ACPR characteristic of −42 dBc and efficiency of 45% could be achieved in the frequency between 1940 to 1960 MHz.

In the high-frequency devices, in general, a ratio Δf/f of a frequency bandwidth Δf for a frequency f is an index indicating the width of a band, and it is difficult to average an RF characteristic within the band as the value gets larger. This also applies to the power amplifier 125, and the larger the ratio Δf/f becomes, the lower the efficiency and the ACPR characteristic become. However, the ratio Δf/f is as low as 1%, therefore, the degradation in the RF characteristic within the operating band cannot be perceived in this case.

Next, the power amplifier illustrated as a second example shall be described.

Along with the widespread of data communication between cell phones, it is an urgent need to increase the number of communication channels. The cell phones adapted for overseas frequency bands are commercialized so that the cell phones can be used abroad. Thus, the tendency in which plural frequency bands are used by one cell phone, so-called, the tendency of multi-band in cell phones is expected to increasingly accelerate in the future. One of the powerful methods for realizing low-cost and miniaturization in the manufacturing of the multi-band cell phones is to use a power amplifier adapted to plural frequency bands.

For example, the shared use of a wide-band CDMA terminal, a kind of the multi-band cell phone and a power amplifier in the two frequency bands of 1.7 GHz band and 1.9 GHz band is conceivable. The frequency range of 1.7 GHz band ranges from 1750 to 1785 MHz, and the frequency range of 1.9 GHz ranges from 1940 to 1960 MHz. For such a shared use in the two frequency bands of 1.7 GHz band and 1.9 GHz band, it is necessary to satisfy desired characteristics in the range between 1750 to 1960 MHz.

The power amplifier 125 of the second example makes certain changes to the output matching circuit 105 in order to be adapted to the frequency band ranging from 1750 to 1960 MHz. More specifically, the length of the microstrip line 111 is set to 3.6 mm and the capacity of the shunt condenser 112 is set to 4.7 pF.

FIG. 4 is a Smith chart showing the impedance ZL (TR) when the output matching circuit 105 is viewed from the output end of the rear stage HBT 102 included in the power amplifier 125 illustrated as the second example. As shown in FIG. 4, it is assumed that the impedance ZL (PA) viewed from the output terminal 116 of the power amplifier 125 is set to 50Ω as a terminating resistor. In this case, the impedance is 5−j0Ω in the frequency of 1850 MHz in the center of the band. However, the impedance is 4.6+j1.6Ω in the frequency of 1960 MHz and is 5.6−j1.6Ω in the frequency of 1750 MHz. When Z0=5Ω is standardized, the VSWR in the terminal 126 is 1.5 or below in the frequency ranging between 1750 and 1960 MHz. It thus seems that the dispersion of the impedance ZL (TR) is enlarged due to the expansion of the frequency band.

FIG. 5 is a diagram showing a table listing the characteristics of the power amplifier 125 illustrated as the second example. As a result of evaluation on the high-frequency power characteristic of the power amplifier 125 under the conditions of a power voltage of 3.5V, an output power of 27 dBm, ACPR characteristic of −42 dBc and efficiency of 45% in the center frequency 1850 MHz are obtained. However, the characteristics degrading is perceived as the frequency gets farther from the center of the band, and ACPR characteristic of −39 dBc and efficiency of 40% are obtained in the lower limit frequency (1750 MHz) while ACPR characteristic of −37 dBc and efficiency of 43% are obtained in the upper limit frequency (1960 MHz).

In the case of the power amplifier 125 of the second example, Δf/f is as high as 10.5%, therefore, both of efficiency and ACPR characteristic decrease in the frequency distant from a center value even within the band (Δf=210 MHz). With a general power amplifier used in a cell phone, the characteristics are degraded in the lower and upper limit frequencies when Δf/f is 5% or higher.

Next, the power amplifier illustrated as a third example shall be described.

FIG. 6 is a diagram showing an outline of a high-frequency power amplifier device which includes the power amplifier 125 illustrated as the third example. As shown in FIG. 6, the transmission wave outputted from the power amplifier 125 is outputted from an antenna 145 via an isolator 141 and a duplexer 142. On the other hand, the reception wave inputted from the antenna 145 is inputted to a reception IC 143 via the duplexer 142.

The isolator 141 is an electric component for transferring high-frequency power only to the output side (duplexer 142 side), and is designed in such a way that the impedance ZL (PA), as an impedance of the isolator 141 viewed from the output terminal 116 of the power amplifier 125, does not change even the impedance between the duplexer 142 and the antenna 145 changes. Since the output terminal 116 of the power amplifier 125 is directly connected to the input terminal of the isolator 141, the input impedance of the isolator 141 becomes the impedance ZL (PA).

FIG. 7 is a Smith chart showing an input impedance of the isolator 141 connected to the output terminal 116 of the power amplifier 125 illustrated as the third example. As shown in FIG. 7, the impedance ZL (PA) is 49+j7.8Ω, 50Ω, 49−j7.9Ω in the frequencies of 1750 MHz, 1850 MHz and 1960 MHz, respectively. The VSWR in the terminal 116 is 1.5 or below in the frequency ranging from 1750 to 1960 MHz.

FIG. 8 is a Smith chart showing the impedance ZL (TR) when the output matching circuit 105 is viewed from the output end of the rear stage HBT 102 included in the power amplifier 125 illustrated as the third example. As shown in FIG. 8, the impedance ZL (TR) is 6.2−j2.4Ω, 5Ω and 4.2+j2.2Ω in the frequencies of 1750 MHz, 1850 MHz and 1960 MHz, respectively. When the VSWR in the terminal 126 is standardized to be Z0=5Ω, the impedance is 2 or below in the frequency ranging from 1750 to 1960 MHz.

In the power amplifier 125 of the third example, as compared with the power amplifier 125 of the second example, by using the isolator 141, the VSWR in the terminal 126 increases from 1.5 or below to 2 or below and the dispersion gets larger. This is attributed to the fact that the input impedance of the isolator 141 has frequency characteristic.

FIG. 9 is a diagram showing a table listing the characteristics of the power amplifier 125 illustrated as the third example. As shown in FIG. 9, the power amplifier 125 was evaluated under the loaded conditions such as a power voltage of 3.5V and an output power of 27 dBm. As a result, ACPR characteristic of −42 dBc and efficiency of 45% are achieved in the center frequency of 1850 MHz. However, the characteristics degrading is perceived as the frequency gets farther from the center of the band, and ACPR characteristic of −37 dBc and efficiency of 40% are gained in the lower limit frequency (1750 MHz) while ACPR characteristic of −37 dBc and efficiency of 43% are obtained in the upper limit frequency (1960 MHz). Thus, Δf/f is as high as 10.5%, and since the use of the isolator further expands the dispersion of the impedance, the decreases of efficiency and ACPR characteristic in the frequency distant from a center value is more notable.

In the conventional power amplifier, however, when the frequency bandwidth is narrow, as in the case of the first example, satisfactory ACPR characteristic and efficiency can be achieved. In the case, however, where the frequency bandwidth gets broader and the ratio Δf/f increases, as in the second example, the frequency dispersion of the impedance ZL (TR) gets larger and ACPR characteristic and efficiency decrease to the extent that the desired characteristics cannot be achieved. Moreover, in the case of directly connecting an isolator to the output side of an amplifier for use, as in the third example, the dispersion of the impedance ZL (TR) gets larger and the decrease in ACPR characteristic and efficiency is much more notable.

SUMMARY OF THE INVENTION

An object of the present invention is to provide a high-frequency power amplifier device with high efficiency and less degradation in broad frequency bandwidth. In order to achieve the above-mentioned object, a high-frequency power amplifier device according to the present invention is a high-frequency power amplifier device which includes: a power amplifier circuit which amplifies a high-frequency signal; an output matching circuit connected to an output side of the power amplifier circuit; and a high-frequency circuit connected to an output side of the output matching circuit, wherein the high-frequency power amplifier device is designed so that X[f] satisfies X[L]<X[H], where j denotes an imaginary number, f denotes a frequency, an impedance of the high-frequency circuit viewed from the output matching circuit is defined as Z[f]=R[f]+jX[f], L denotes a lower limit of the frequency, and H denotes an upper limit of the frequency.

Moreover, the high-frequency power amplifier device may be configured so that X[L] is a negative value and X[H] is a positive value.

Alternatively, the high-frequency power amplifier device may be configured so that the high-frequency power amplifier device, the power amplifier circuit, the output matching circuit and the phase shift circuit are configured in a same package.

According to the high-frequency power amplifier device of the present invention, by reducing or overcoming the frequency dispersion of the impedance ZL (PA), it is possible to realize ACPR characteristic of −42 dBc and efficiency of 45% in all the frequencies ranging from 1750 to 1960 MHz under the loaded conditions such as a power voltage of 3.5V and an output power of 27 dBm. With the conventional high-frequency power amplifier device, characteristics degradation is perceived in the frequencies at the both ends when the ratio Δf/f is 10.5%. According to the high-frequency power amplifier device of the present invention, however, satisfactory characteristics can be realized in all the bands even when the ratio Δf/f is 10.5%. In this way, it is possible to provide the high-frequency power amplifier device that can operate with high efficiency and less degradation in broad band width.

In addition, according to the present invention, there is no need to separately design a power amplifier and a phase shift circuit in the development of a cell phone, and thus enables easy development. Also, there is no need to separately implement a power amplifier and a phase shift circuit in the manufacturing process, it is possible to reduce the number of components to be implemented.

FURTHER INFORMATION ABOUT TECHNICAL BACKGROUND TO THIS APPLICATION

The disclosure of Japanese Patent Application No. 2006-091207 filed on Mar. 29, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 3 is a table listing the characteristics of the conventional power amplifier illustrated as the first example;

FIG. 5 is a table listing the characteristics of the power amplifier illustrated as the second example;

FIG. 9 is a table listing the characteristics of the power amplifier illustrated as the third example;

FIG. 14 is a diagram showing a table listing the characteristics of the high-frequency power amplifier device according to the first embodiment;

FIG. 25 is a diagram showing a table listing the characteristics of the high-frequency power amplifier device according to the fifth embodiment;

DESCRIPTION OF THE PREFERRED EMBODIMENT(S)

First Embodiment

The following describes the first embodiment of the present invention with reference to the drawings.

Note that the same referential marks are provided to the same components as those included in the high-frequency power amplifier described in the Description of the Related Art.

Figure 1:
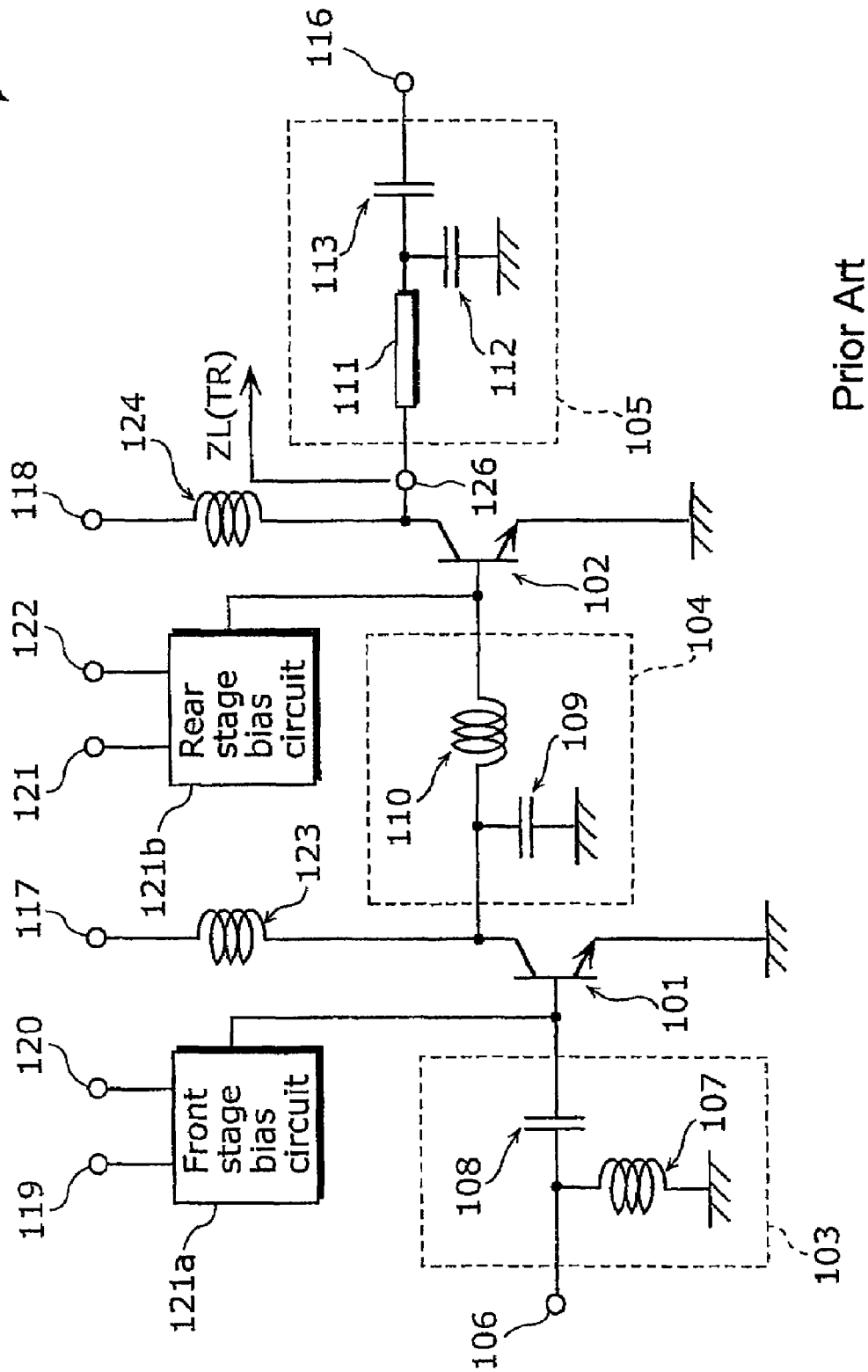
FIG. 1 is a diagram showing an outline of the conventional power amplifier illustrated as a first example.
Figure 2:
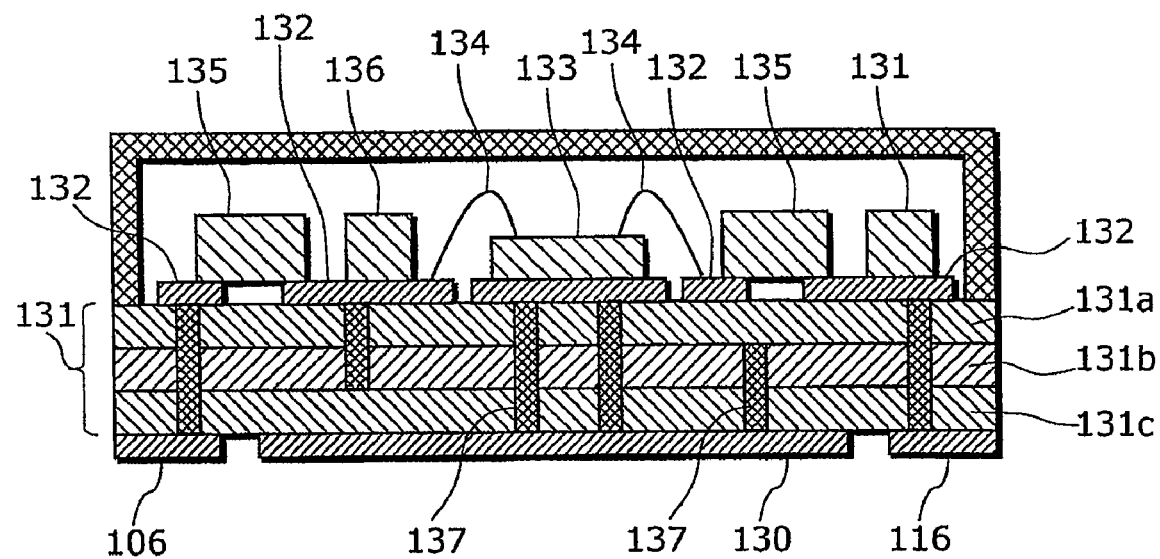
FIG. 2 is a diagram showing the structure of the conventional power amplifier illustrated as the first example.
Figure 4:
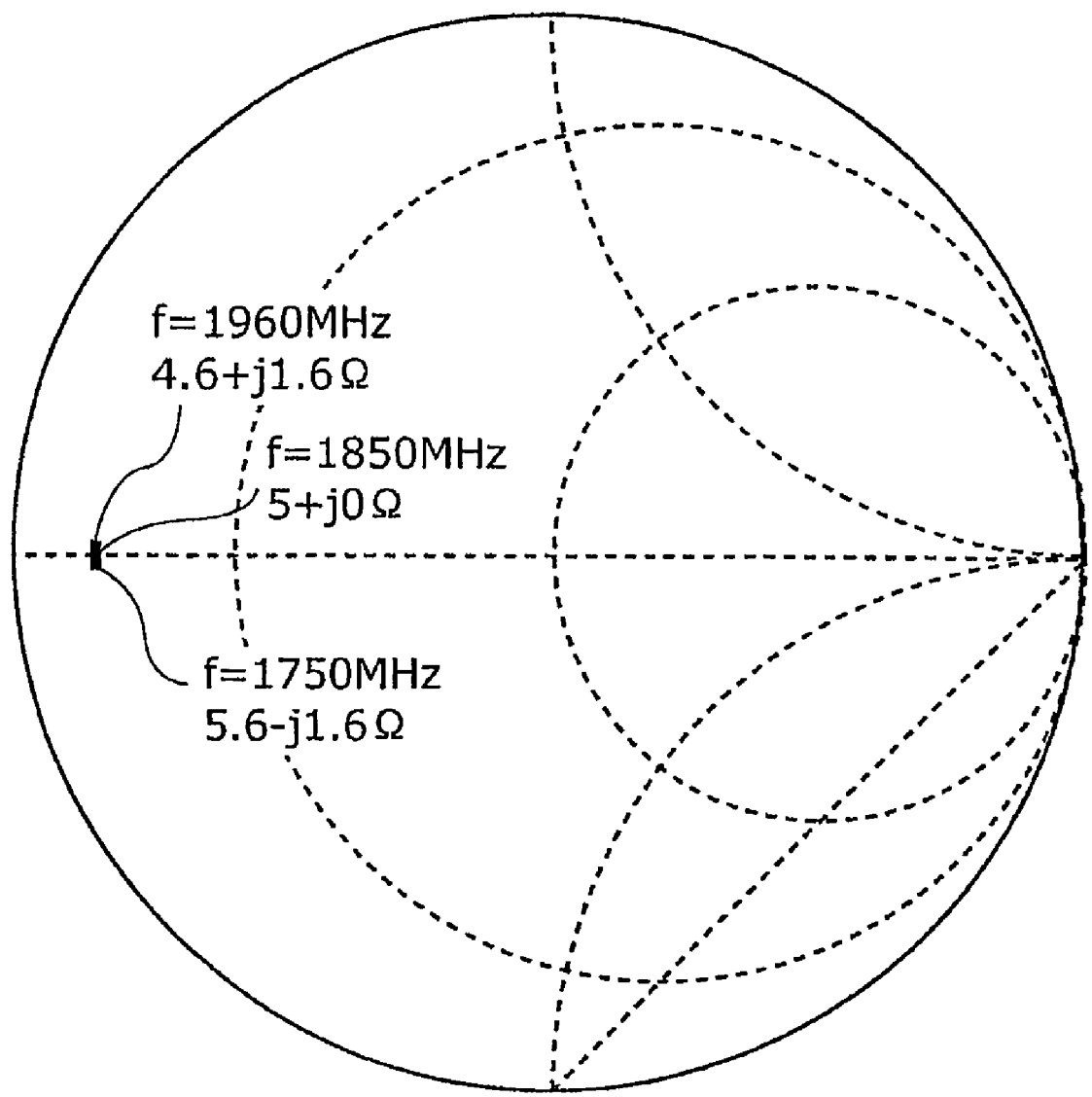
FIG. 4 is a Smith chart showing the impedance ZL (TR) as an impedance of an output matching circuit viewed from an output end of a rear stage HBT included in the power amplifier illustrated as a second example.
Figure 6:
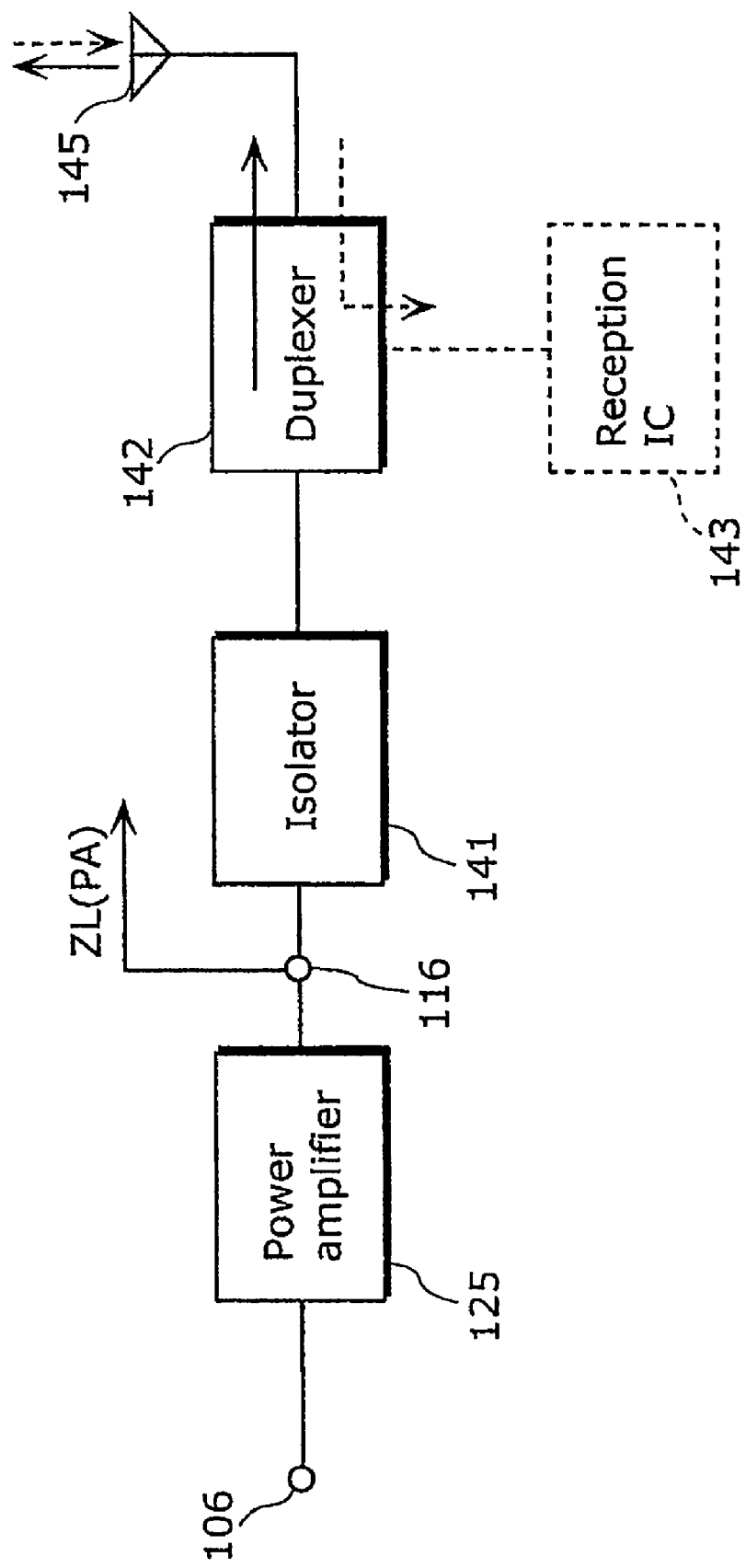
FIG. 6 is a diagram showing an outline of a high-frequency power amplifier device which includes a conventional power amplifier illustrated as a third example.
Figure 10:
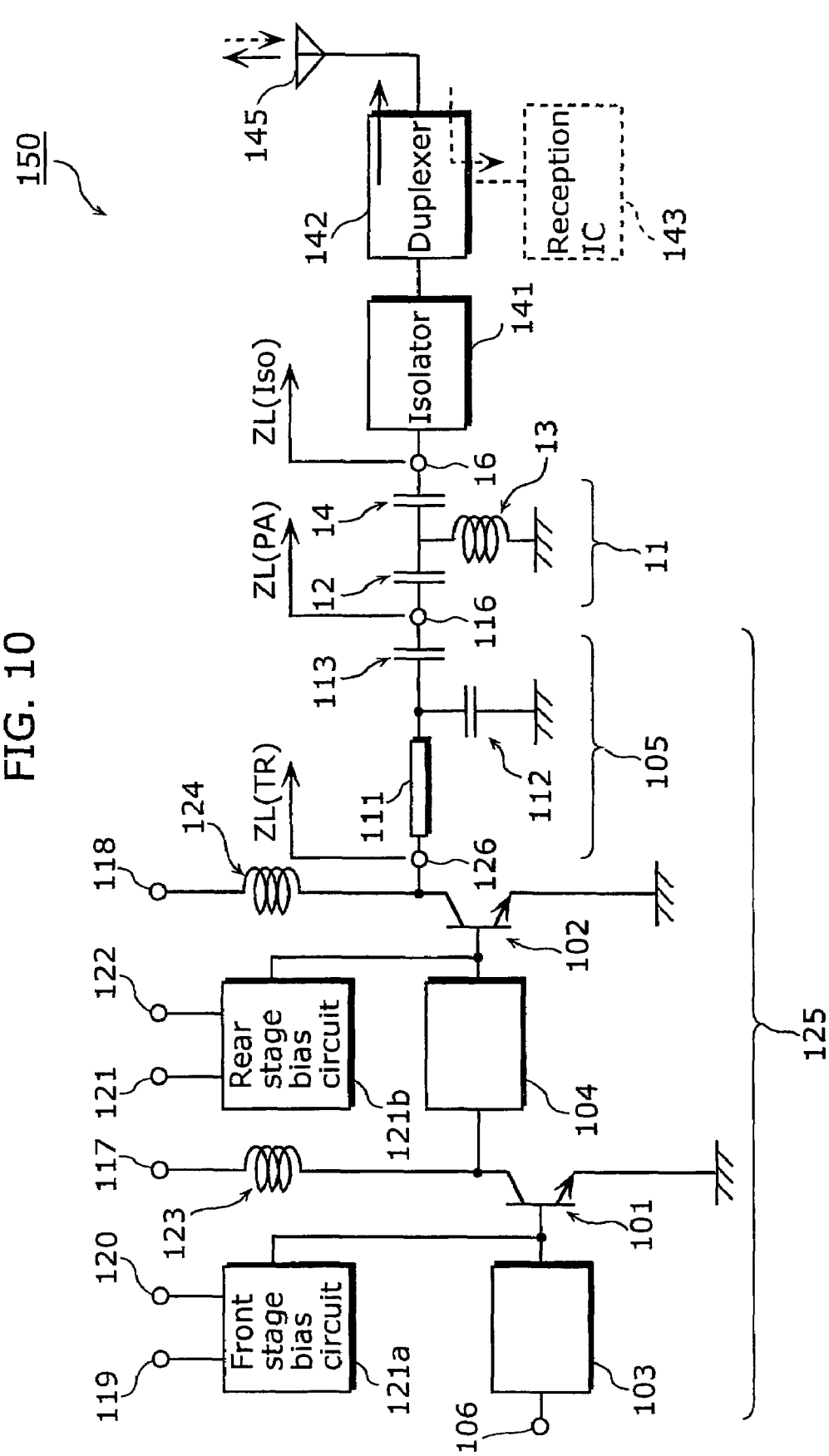
FIG. 10 is a diagram showing an outline of the high-frequency power amplifier device according to a first embodiment of the present invention.

FIG. 10 is a diagram showing an outline of the high-frequency power amplifier device according to the embodiment. As shown in FIG. 10, a high-frequency power amplifier device 150 of the present embodiment is different from the conventional high-frequency power amplifier device (see FIG. 6) in that a phase shift circuit 11 is connected between the output terminal 116 of the power amplifier 125 and the input terminal 16 of the isolator 141.

The phase shift circuit 11 is configured of a serial condenser 12, a shunt inductor 13, and a serial condenser 14 in an order closest to the input side. The serial condenser 12 is 1.9 pF, the shunt inductor 13 is 4.1 nH and the serial condenser 14 is 1.9 pF. The degree of the phase rotation performed from the terminal 16 to the terminal 116 is −170 degrees (a positive rotation is in clockwise direction) in the frequency of 1850 MHz.

Figure 7:
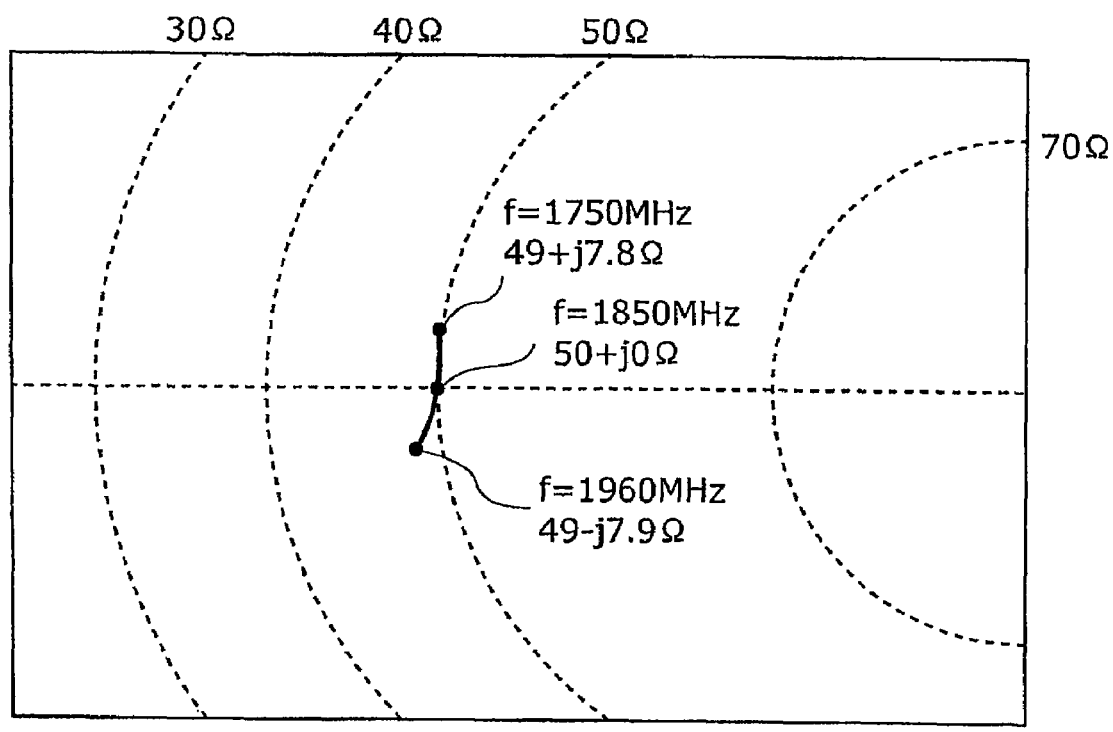
FIG. 7 is a Smith chart showing an input impedance of an isolator connected to an output terminal of the power amplifier illustrated as the third example.

The Smith chart showing the impedance ZL (Iso) in the terminal 16 of the isolator 141 is as same as the one shown in FIG. 7, and the VSWR in the terminal 16 is 1.5 or below in the frequency ranging from 1750 to 1960 MHz. Assuming here that the impedance ZL (Iso) of the frequency f is expressed by ZL (Iso) [f]=R (Iso) [f]+jX (Iso) [f], the impedance ZL (Iso) satisfies the relationship expressed as X (Iso) [1750 MHz]>X (Iso) [1850 MHz]>X (Iso) [1960 MHz].

Moreover, ZL (Iso) [1750 MHz] is located in an inductive region on the Smith chart, while ZL (Iso) [1960 MHz] is located in a capacitive region. In other words, X (Iso) [1750 MHz] indicates a positive value and X (Iso) [1960 MHz] indicates a negative value.

Figure 11:
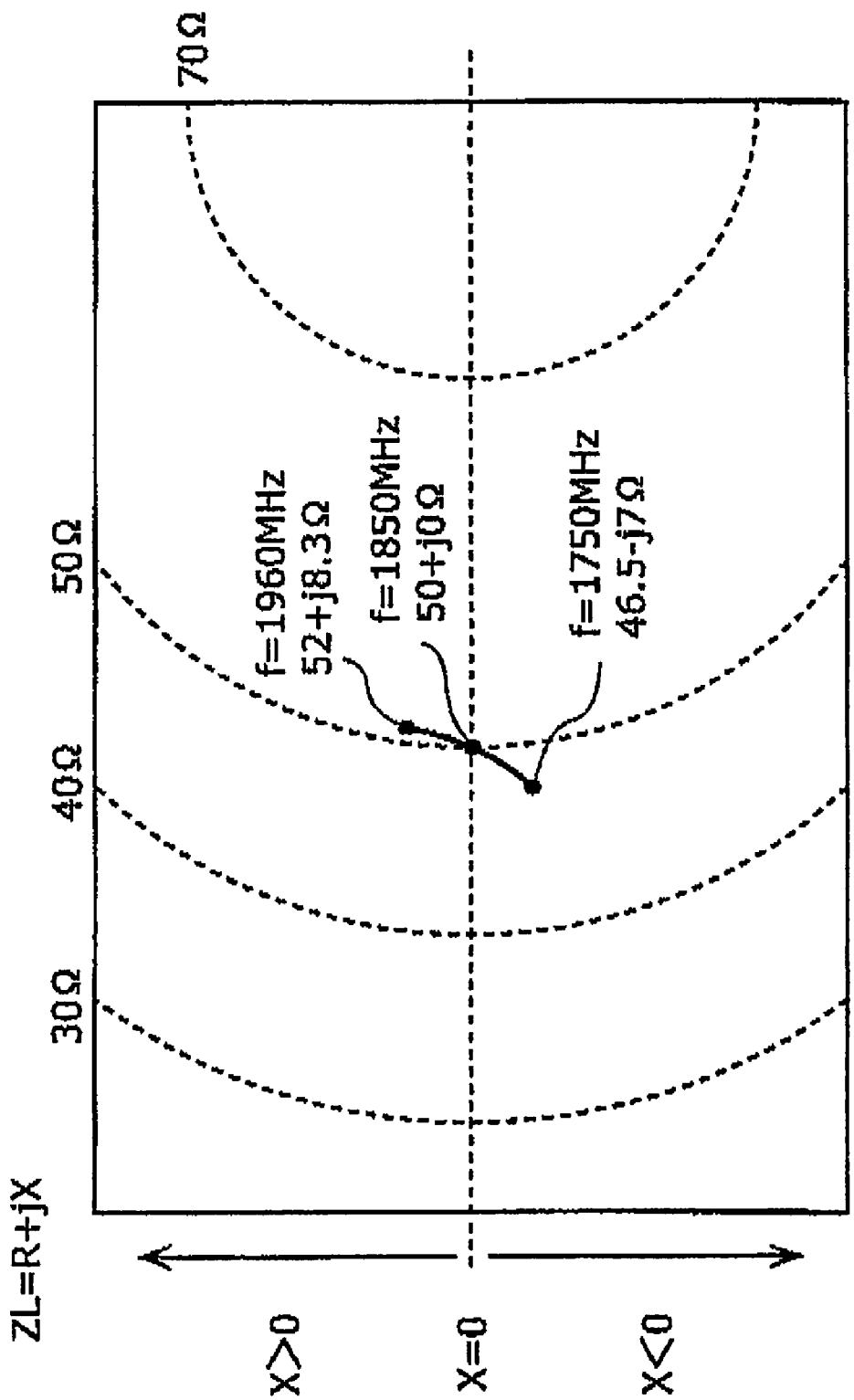
FIG. 11 is a Smith chart showing the impedance ZL (PA) as an impedance of a phase shift circuit viewed from an output terminal of a power amplifier.

FIG. 11 is a Smith chart showing the impedance ZL (PA) as an impedance of the phase shift circuit 11 viewed from the output terminal 116 of the power amplifier 125. As shown in FIG. 11, the impedance ZL (PA) is 46.5−j7Ω, 50Ω and 52+j8.3Ω in the frequencies of 1750 MHz, 1850 MHz and 1960 MHz, respectively. The VSWR in the terminal 116 is 1.5 or below in the frequency ranging from 1750 to 1960 MHz. Moreover, by using the phase shift circuit 11, the impedance ZL (PA) is placed in the position where impedance ZL (Iso) is rotated by −170 degrees on the Smith chart.

Assuming that the impedance ZL (PA) of the frequency f is defined as ZL (PA) [f]=R (PA) [f]+jX (PA) [f], the impedance ZL (PA) satisfies the relationship expressed as X (PA) [1750 MHz]<X (PA) [1850 MHz]<X (PA) [1960 MHz], and the frequency characteristics of the impedance ZL (PA) is opposite to those of the impedance ZL (Iso). Note that X (PA) [f] monotonously increases as the frequency f increases.

Moreover, ZL (PA) [1750 MHz] is located in a capacitive region, and ZL (PA) [1960 MHz] is located in an inductive region on the Smith chart. In other words, X (PA) [1750 MHz] is a negative value and X (PA) [1960 MHz] is a positive value.

Furthermore, the impedance ZL (PA) satisfies the relationship expressed as R (PA) [1750 MHz]<R (PA) [1850 MHz] <R (PA) [1960 MHz], and R (PA) [f] monotonously increases as the frequency f increases. Also, the impedance ZL (PA) satisfies the relationship expressed as R (PA) [1750 MHz] <50Ω and R (PA) [1960 MHz]>50Ω.

Figure 12:
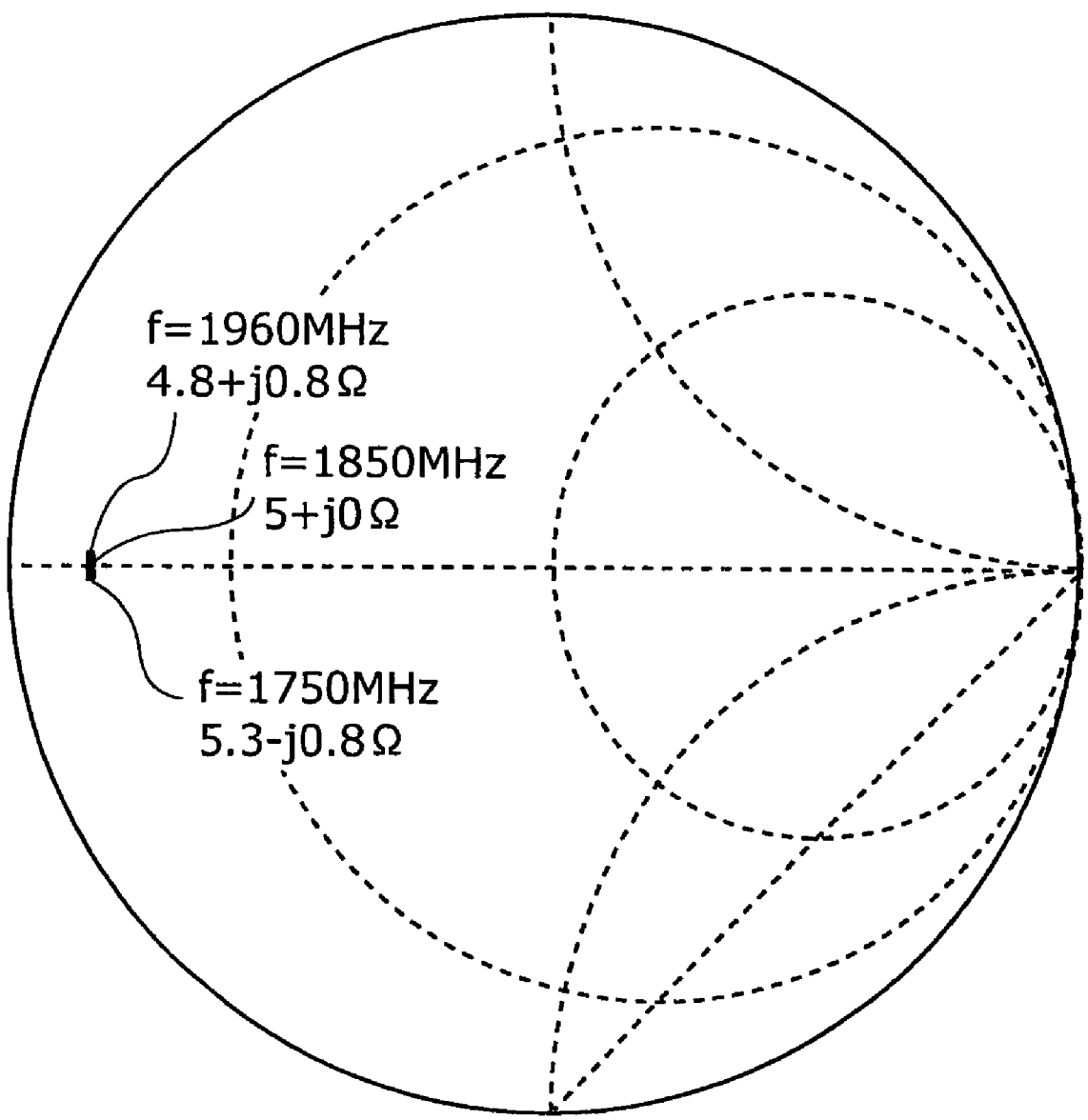
FIG. 12 is a Smith chart showing the impedance ZL (TR) as an impedance of an output matching circuit viewed from an output end of a rear stage HBT.

FIG. 12 is a Smith chart showing the impedance ZL (TR) as an impedance of the output matching circuit 105 viewed from the output end of the rear stage HBT 102. As shown in FIG. 12, the impedance ZL (TR) is 5.3−j0.8Ω, 5Ω and 4.8+j0.8Ω in the frequencies of 1750 MHz, 1850 MHz and 1960 MHz, respectively. When Z0=5Ω is standardized, the VSWR in the terminal 126 is 1.2 or below.

In the case of the conventional high-frequency power amplifier device illustrated as the third example, the VSWR (VSWR=2) in the terminal 126 is larger than the VSWR (VSWR=1.5) in the terminal 16. In contrast, the embodiment has an important characteristic that the VSWR in the terminal 126 is smaller than the VSWR in the terminal 16. That is to say that the dispersion gets larger in the conventional technology whereas the dispersion gets smaller in the embodiment. The phase shift circuit 11 has thus a function to reduce the dispersion of VSWR in the terminal 126 than the dispersion of VSWR in the terminal 16.

Here, the reason why the dispersion of the impedance ZL (TR) is reduced shall be described with reference to a Smith chart.

Figure 13:
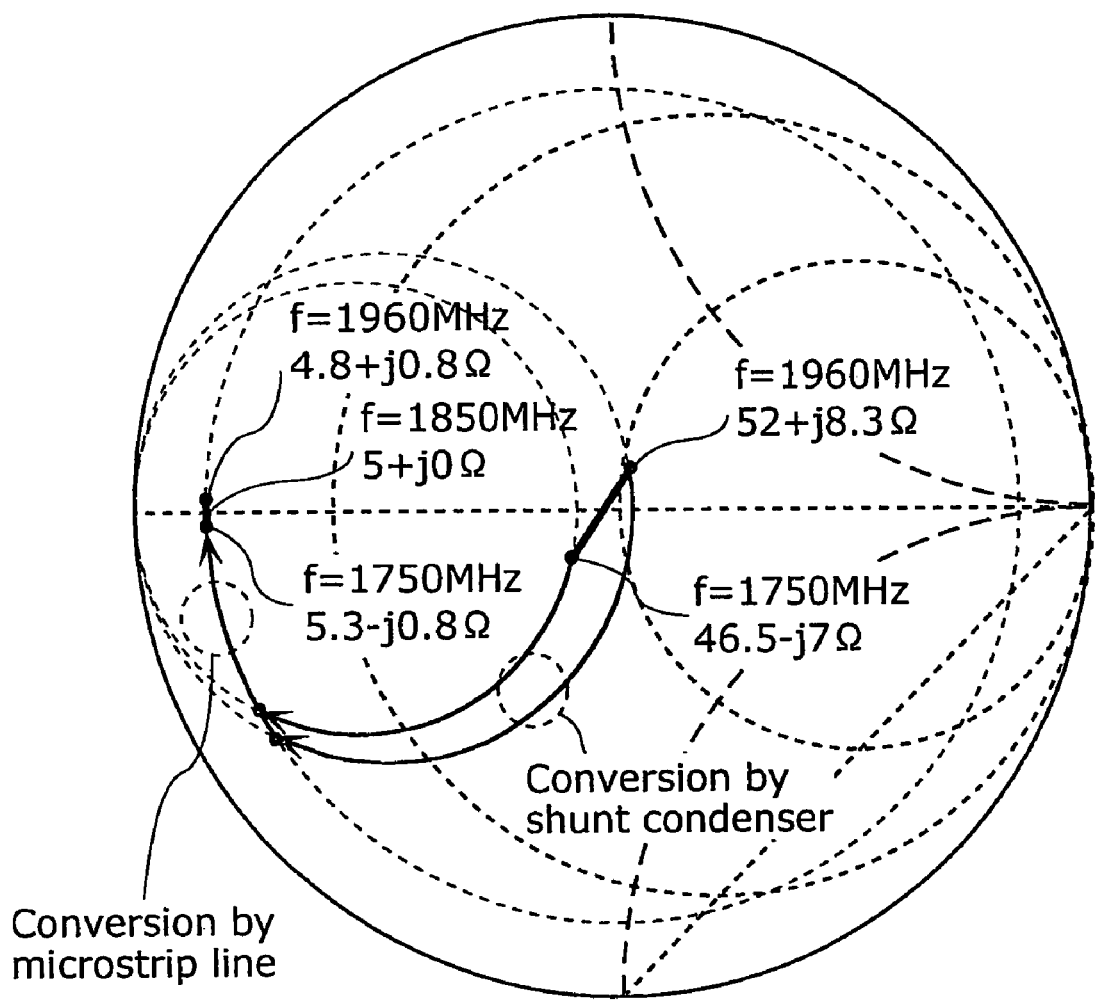
FIG. 13 is a diagram showing impedance conversion from impedance ZL (PA) to impedance ZL (TR)

FIG. 13 is a diagram showing impedance conversion from impedance ZL (PA) to impedance ZL (TR). As shown in FIG. 13, conversion by a shunt condenser and conversion by a microstrip line are respectively equivalent to the conversions by the shunt condenser 112 and the microstrip line 111 shown in FIG. 10. The conversion by a shunt condenser, as shown in FIG. 13, is a rotation along an admittance line, and defining that C denotes a capacity of a condenser, an angle speed ω is expressed by ω=2πf, a conversion amount is represented by jωC.

Since the conversion amount increases as the frequency gets higher, in order to reduce the dispersion of the impedance ZL (TR), it is preferable to increase a value indicating admittance component in the higher frequencies. More specifically, assuming that ZL (PA) [f]=R (PA) [f]+jX (PA) [f] is defined, L denotes the lower limit of frequency and H denotes the upper limit of frequency, the impedance ZL (PA) may be defined so as to satisfy the relationship expressed as X (PA) [L]<X (PA) [H]. In addition, this expression can be satisfied even when X (PA) [L] is selected to be a negative value and X (PA) [H] is selected to be a positive value, or when ZL (PA) [L] is selected to be located in a capacitive region while ZL (PA) [H] is selected to be located in an inductive region on the Smith chart.

In the rotation along an admittance line performed by a shunt condenser, when rotation of high frequency is performed along the outer admittance circle, it is possible to reduce the dispersion of the impedance ZL (TR). For this, it is preferable to increase a value indicating resistance component in the higher frequencies with respect to the frequency characteristic of the impedance ZL (PA). More specifically, assuming that ZL (PA) [f]=R (PA) [f]+jX (PA) [f] is defined, L denotes the lower limit of frequency and H denotes the upper limit of frequency, the impedance ZL (PA) may be defined so as to satisfy the relationship expressed as R (PA) [L]<R (PA) [H]. The expression can be satisfied even when R (PA) [L] is selected to be a value smaller than 50Ω and R (PA) [H] is selected to be a value greater than 50Ω.

FIG. 14 is a diagram showing a table listing the characteristics of the high-frequency power amplifier device according to the embodiment. As shown in FIG. 14, the power amplifier 125 was evaluated, as an example, under the loaded conditions such as a power voltage of 3.5V and an output power of 27 dBm. As a result, the VSWR in the terminal 126 was as low as 1.2 or below. Moreover, in the frequency defined as the lower limit (1750 MHz), ACPR characteristic of −41 dBc and efficiency of 43% were obtained, whereas in the frequency defined as the upper limit (1960 MHz), ACPR characteristic of −39 dBc and efficiency of 44% were obtained. Thus, the characteristics were improved in the frequencies defined as the upper limit and the lower limit.

As stated above, with the power amplifier 125 of the embodiment, the characteristics in the frequencies of the upper and lower limits (1750 MHz, 1960 MHz) were greatly enhanced in spite of the broad bandwidth for use (Δf/f=10.5%). In addition, as long as the frequency bandwidth is limited to the frequency ranging from 1790 MHz to 1910 MHz (Δf=120 MHz), ACPR characteristic of −42 dBc and efficiency of 45% were gained even under the conditions such as a power voltage of 3.5V and an output power of 27 dBm. With the conventional power amplifier 125, characteristics are degraded in the frequencies at the both ends when Δf/f becomes 5% or higher. With the power amplifier 125 of the embodiment, it is possible to realize satisfactory characteristics in the entire bandwidth even the ratio Δf/f is 6.1%.

Figure 8:
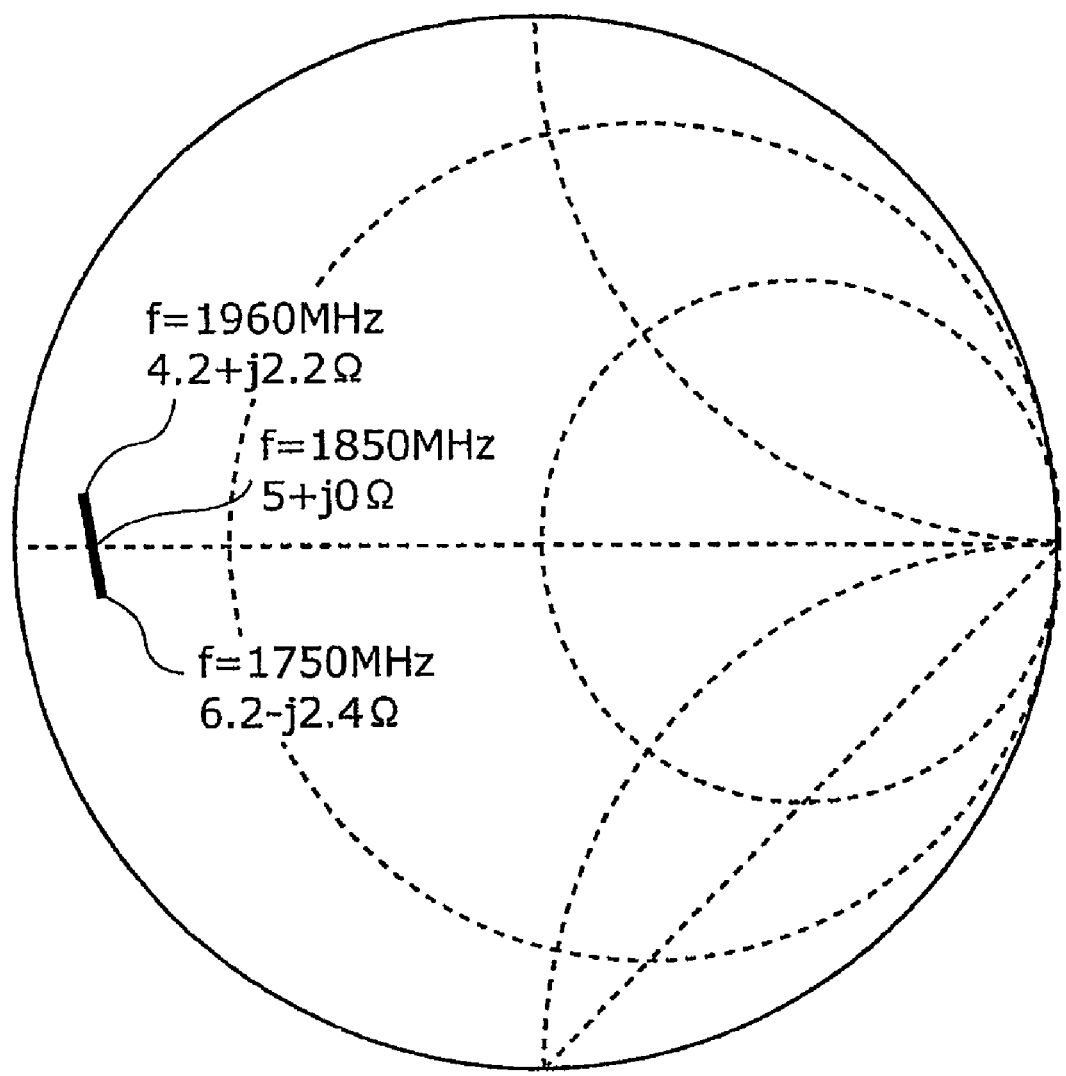
FIG. 8 is a Smith chart showing the impedance ZL (TR) as an impedance of an output matching circuit viewed from an output terminal of a rear stage HBT included in the power amplifier illustrated as the third example.
Figure 15:
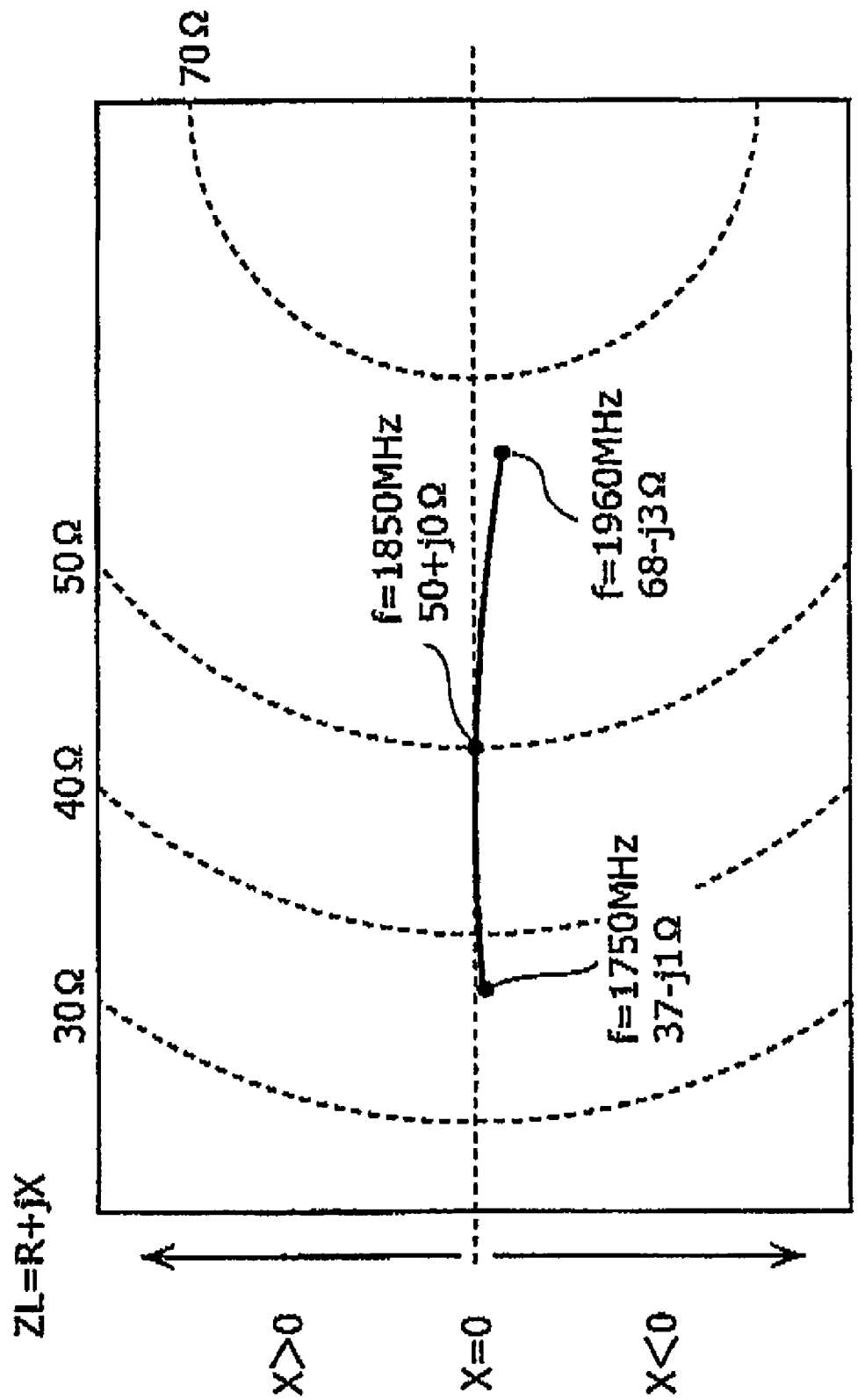
FIG. 15 is a Smith chart showing the impedance ZL (PA) in the case of setting a phase rotation by a phase shift circuit to −90 degrees.
Figure 16:
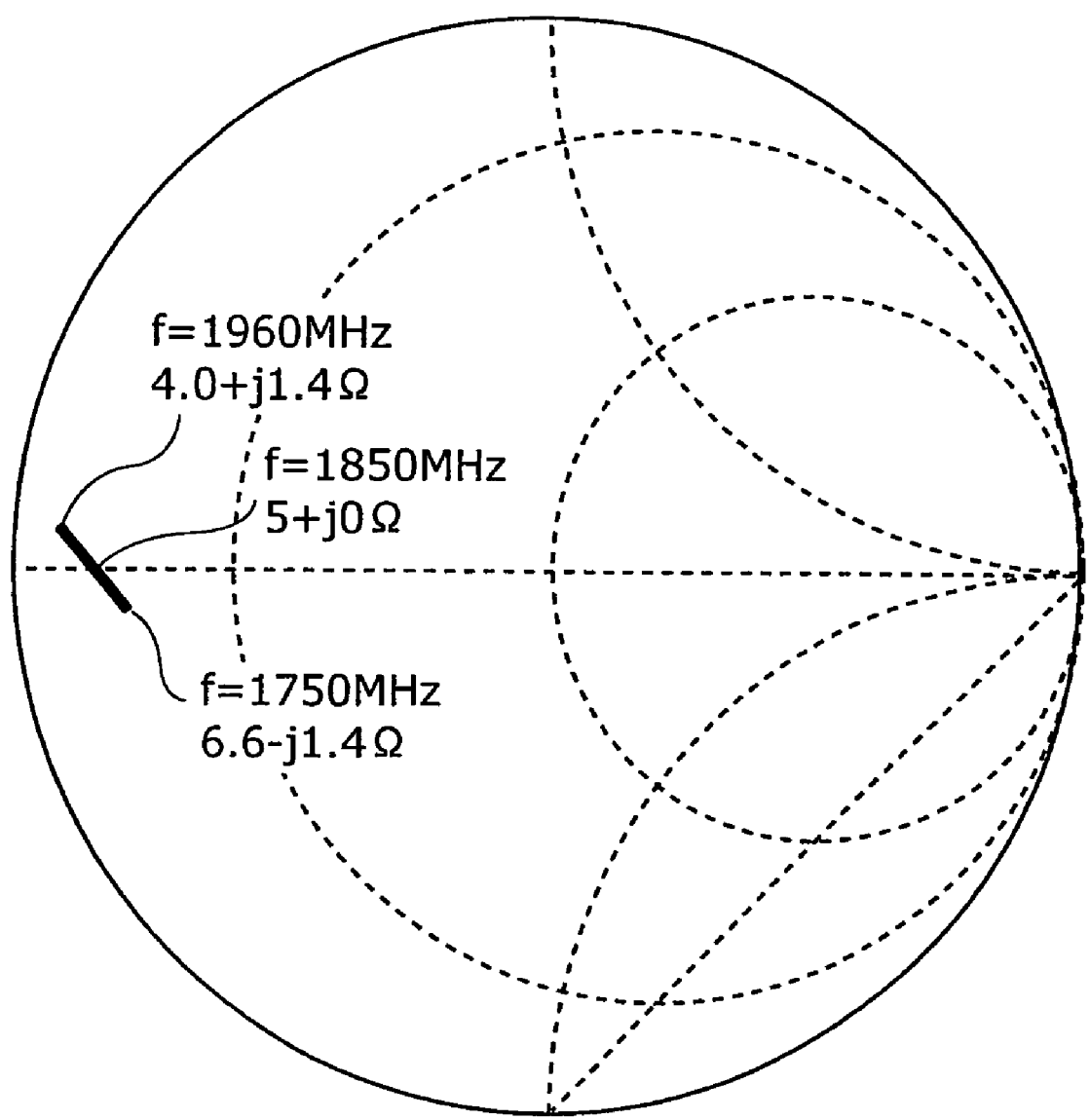
FIG. 16 is a Smith chart showing the impedance ZL (TR) as an impedance of an output matching circuit viewed from an output end of a rear stage HBT.

Furthermore, as a result of conducting a detailed search, it is verified that by setting the phase rotation to be −90 degrees or less, the characteristics of the phase shift circuit 11 of the embodiment are improved in the frequencies of the upper and lower limits as shown in FIG. 15. Compared with the Smith chart of the impedance ZL (TR) described with reference to FIG. 8 in the Description of the Related Art, it is acknowledged that the frequency dispersion of the impedance is smaller, as shown in FIG. 16.

Second Embodiment

The following describes the second embodiment of the present invention with reference to the drawings.

Figure 17:
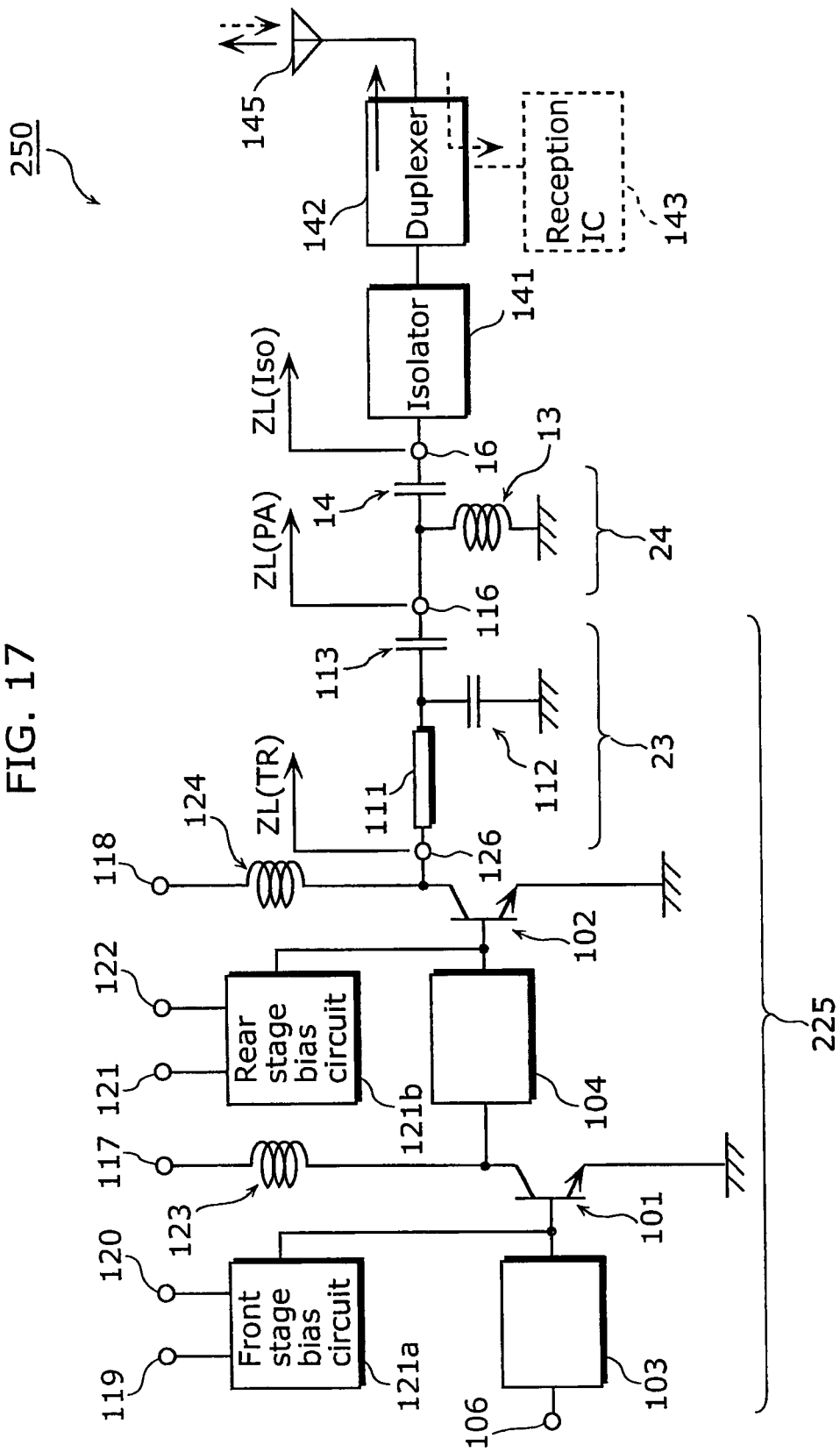
FIG. 17 is a diagram showing an outline of the high-frequency power amplifier device according to a second embodiment of the present invention.

FIG. 17 is a diagram showing an outline of the high-frequency power amplifier device according to the embodiment. As shown in FIG. 17, in a high-frequency power amplifier device 250 according to the present embodiment, a condenser having a composite capacity of the serial condenser 113 in the output matching circuit 105 and the serial condenser 12 in the phase shift circuit 11 is used for a serial condenser 22 in an output matching circuit 23, which is different from the high-frequency power amplifier device 150 of the first embodiment. Moreover, another difference is that a condenser in a phase shift circuit 24 is omitted. By applying such a configuration, it is possible to reduce the number of condensers by 1 with the same performance being maintained.

Third Embodiment

The following describes the third embodiment of the present invention with reference to the drawings.

Figure 18:
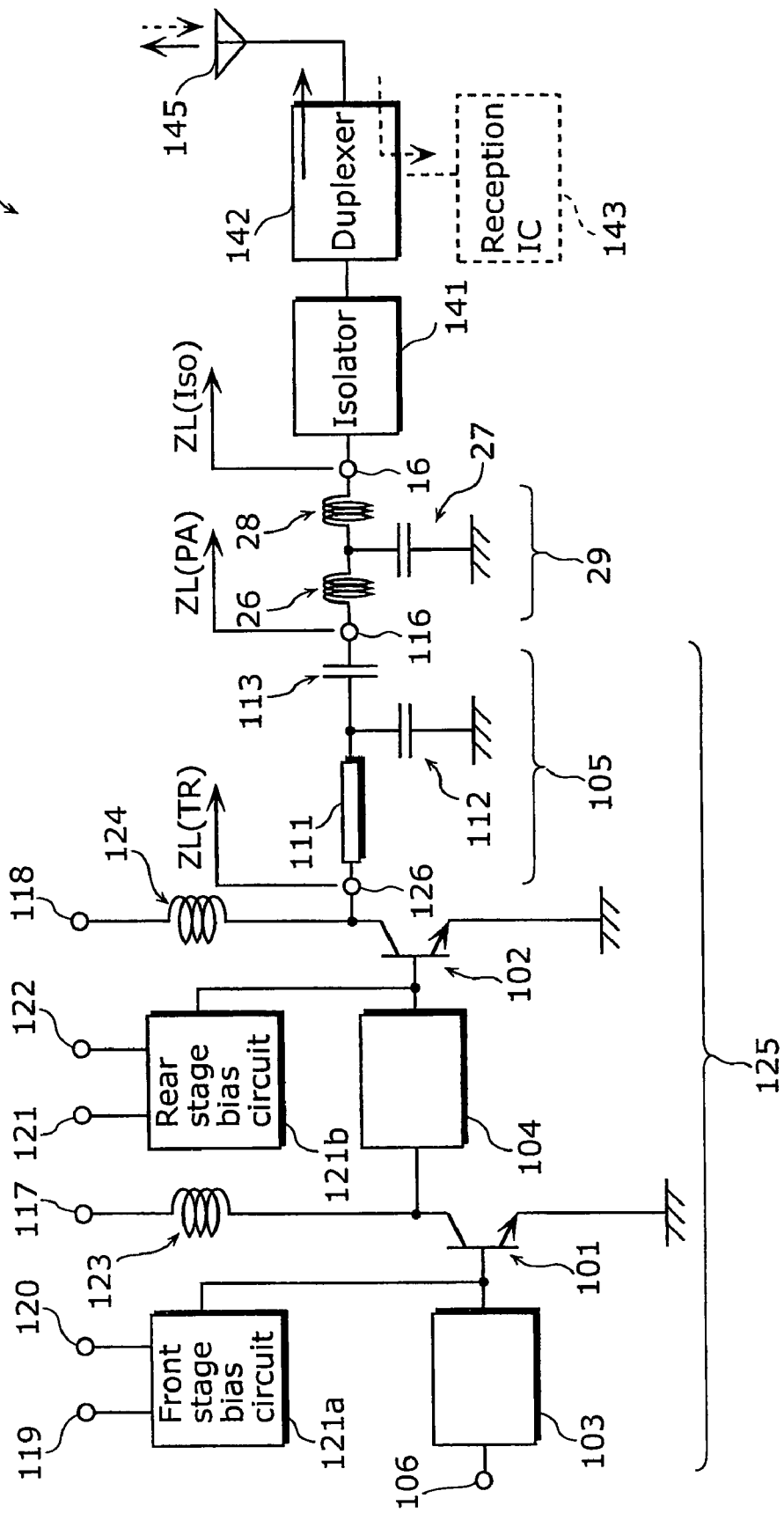
FIG. 18 is a diagram showing an outline of the high-frequency power amplifier device according to a third embodiment of the present invention.

FIG. 18 is a diagram showing an outline of the high-frequency power amplifier device according to the embodiment. As shown in FIG. 18, a high-frequency power amplifier device 350 of the present embodiment is different from the high-frequency power amplifier device 150 (see FIG. 10) of the first embodiment in that a phase shift circuit 29 is used instead of the phase shift circuit 11.

The phase shift circuit 29 is configured of a serial inductor 26, a shunt condenser 27 and a serial condenser 28 in an order closest to the input side. The serial inductor 26 is 5.6 nH, the shunt condenser 27 is 1.7 pF and the serial inductor 28 is 5.6 nH. The degree of the phase rotation performed from the terminal 16 to the terminal 116 is +190 degrees (a positive rotation is in clockwise direction) in the frequency of 1850 MHz.

Note that even with the high-frequency power amplifier device 350 of the present embodiment, the same effects can be obtained as those achieved by the high-frequency power amplifier device 150 of the first embodiment.

Figure 19:
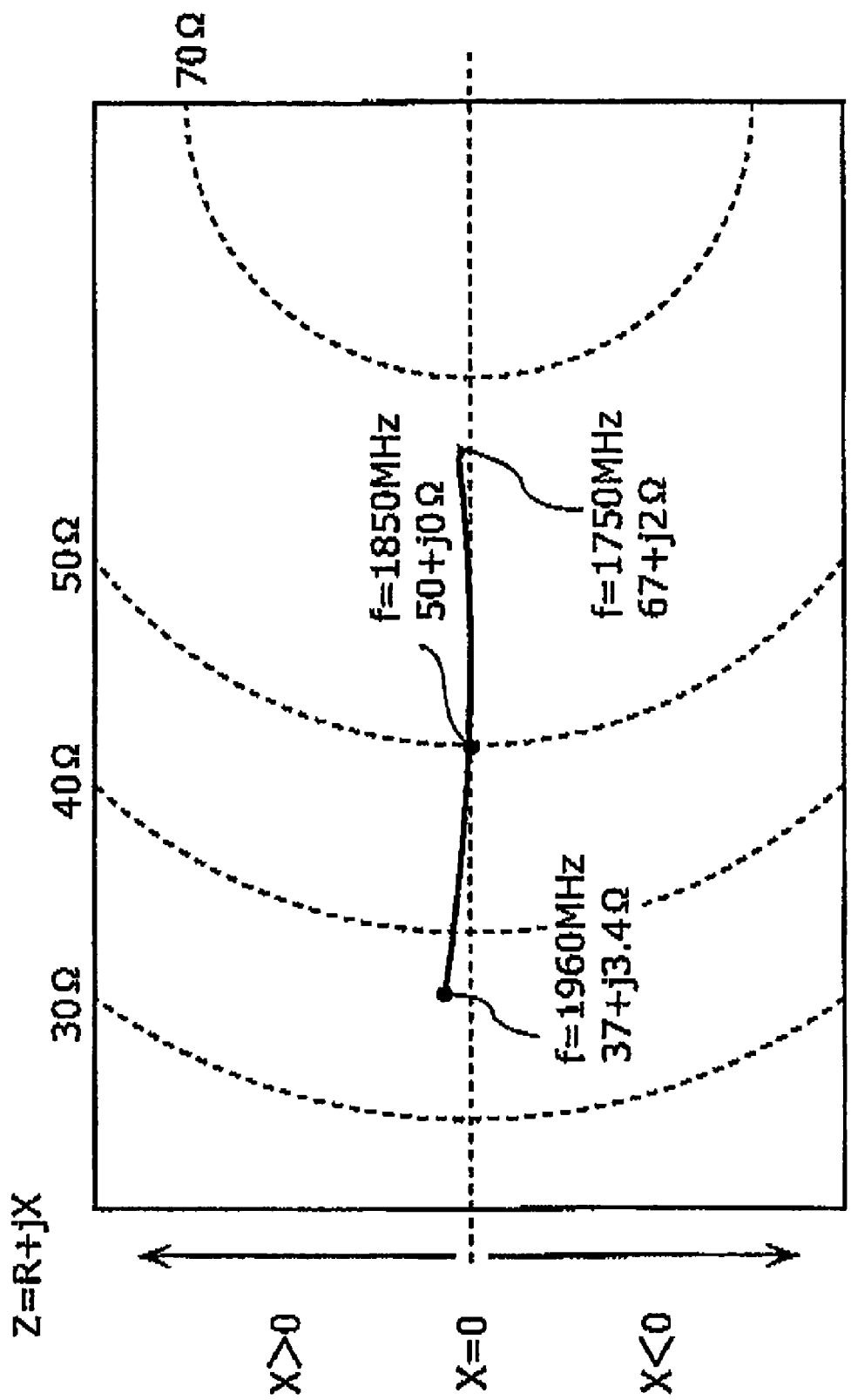
FIG. 19 is a Smith chart showing the impedance ZL (PA) in the case of setting a phase rotation by a phase shift circuit to 90 degrees.
Figure 20:
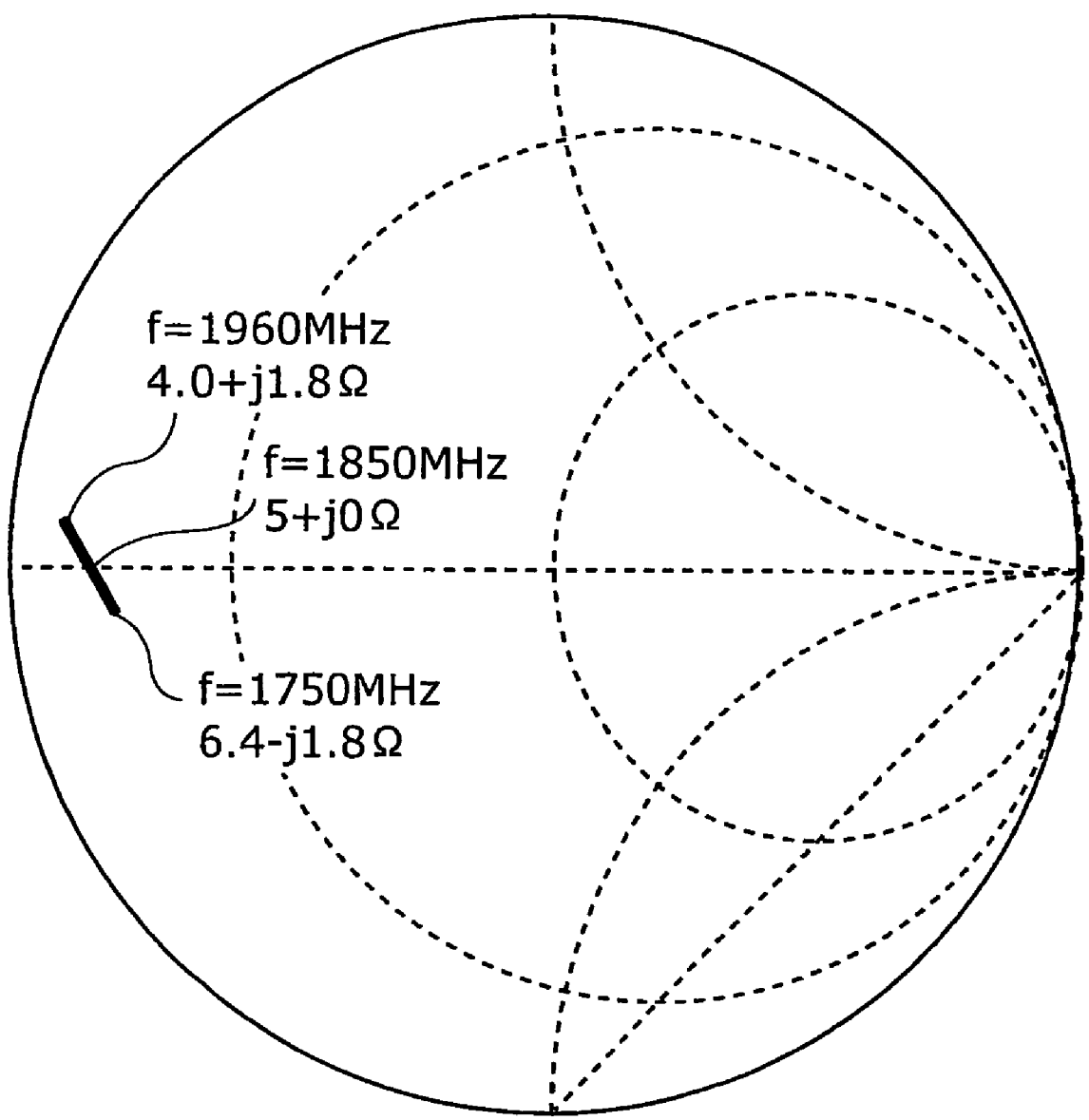
FIG. 20 is a Smith chart showing the impedance ZL (TR) as an impedance of an output matching circuit viewed from an output end of a rear stage HBT.

Moreover, as a result of conducting a detailed search, it is verified that by setting the phase rotation to be 90 degrees or more, the characteristics of the phase shift circuit 29 of the embodiment are improved in the frequencies of the upper and lower limits as shown in FIG. 19. Compared with the Smith chart of the impedance ZL (TR) described with reference to FIG. 8 in the Description of the Related Art, it is acknowledged that the frequency dispersion of the impedance is smaller, as shown in FIG. 20.

Fourth Embodiment

The following describes the fourth embodiment of the present invention with reference to the drawings.

Figure 21:
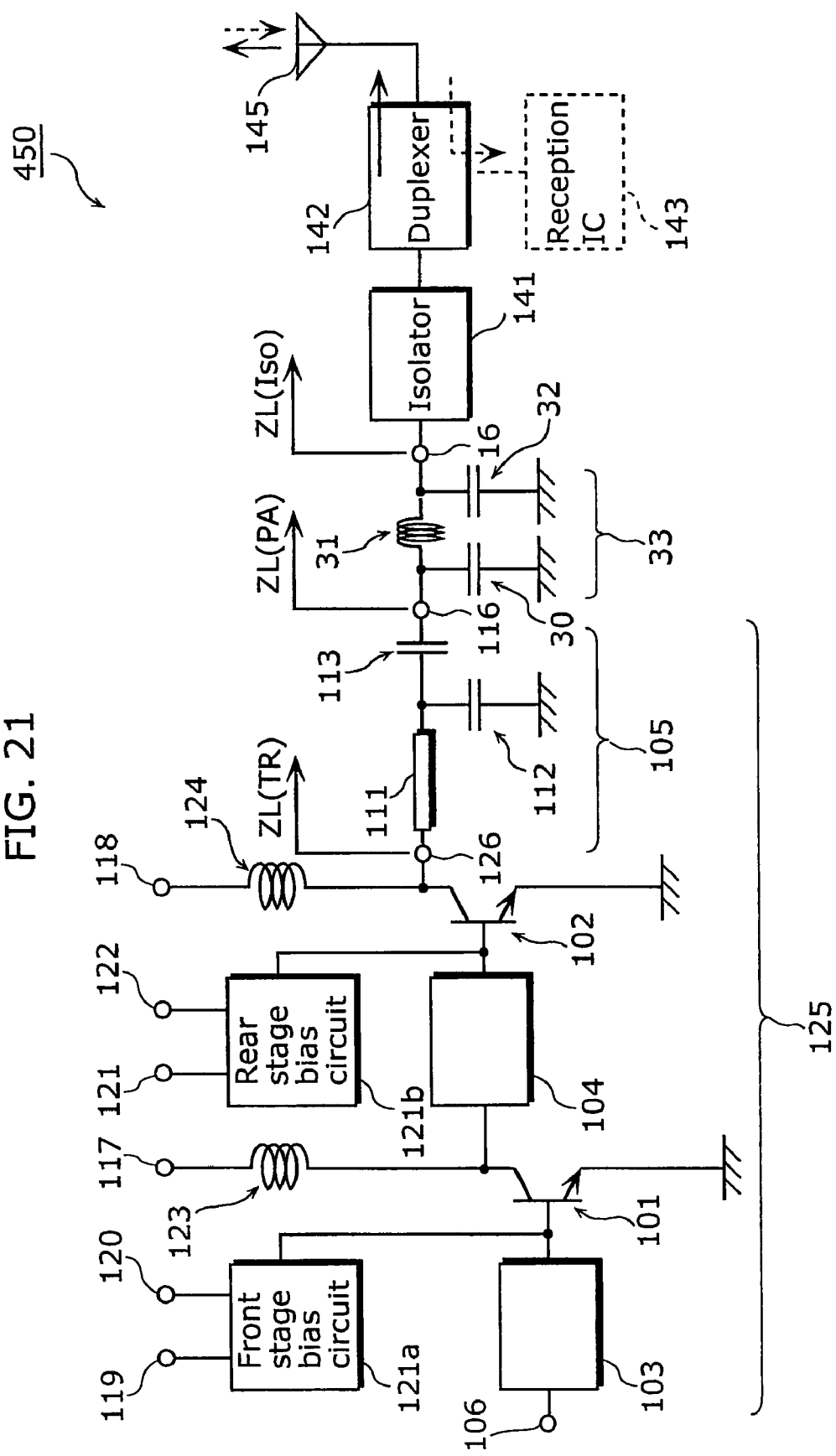
FIG. 21 is a diagram showing an outline of the high-frequency power amplifier device according to a fourth embodiment of the present invention.

FIG. 21 is a diagram showing an outline of the high-frequency power amplifier device according to the embodiment. As shown in FIG. 21, a high-frequency power amplifier device 450 of the present embodiment is different from the high-frequency power amplifier device 150 (see FIG. 10) of the first embodiment in that a phase shift circuit 33 is used instead of the phase shift circuit 11.

The phase shift circuit 33 is configured of a shunt condenser 30, a serial inductor 31 and a shunt condenser 32 in an order closest to the input side. The shunt condenser 30 is 1.9 pF, the serial inductor 31 is 4.1 nH and the shunt condenser 32 is 1.9 pF. The degree of the phase rotation performed from the terminal 16 to the terminal 116 is +190 degrees (a positive rotation is in clockwise direction) in the frequency of 1850 MHz.

Note that even with the high-frequency power amplifier device 450 of the present embodiment, the same effects can be obtained as those achieved by the high-frequency power amplifier device 150 of the first embodiment.

Fifth Embodiment

The following describes the fifth embodiment of the present invention with reference to the drawings.

Note that the high-frequency power amplifier device of the present embodiment has the same configuration as that of the high-frequency power amplifier device 150 (see FIG. 10) of the first embodiment except for the characteristics of an isolator. The same referential marks are provided to the same components, and the descriptions shall be omitted.

Figure 22:
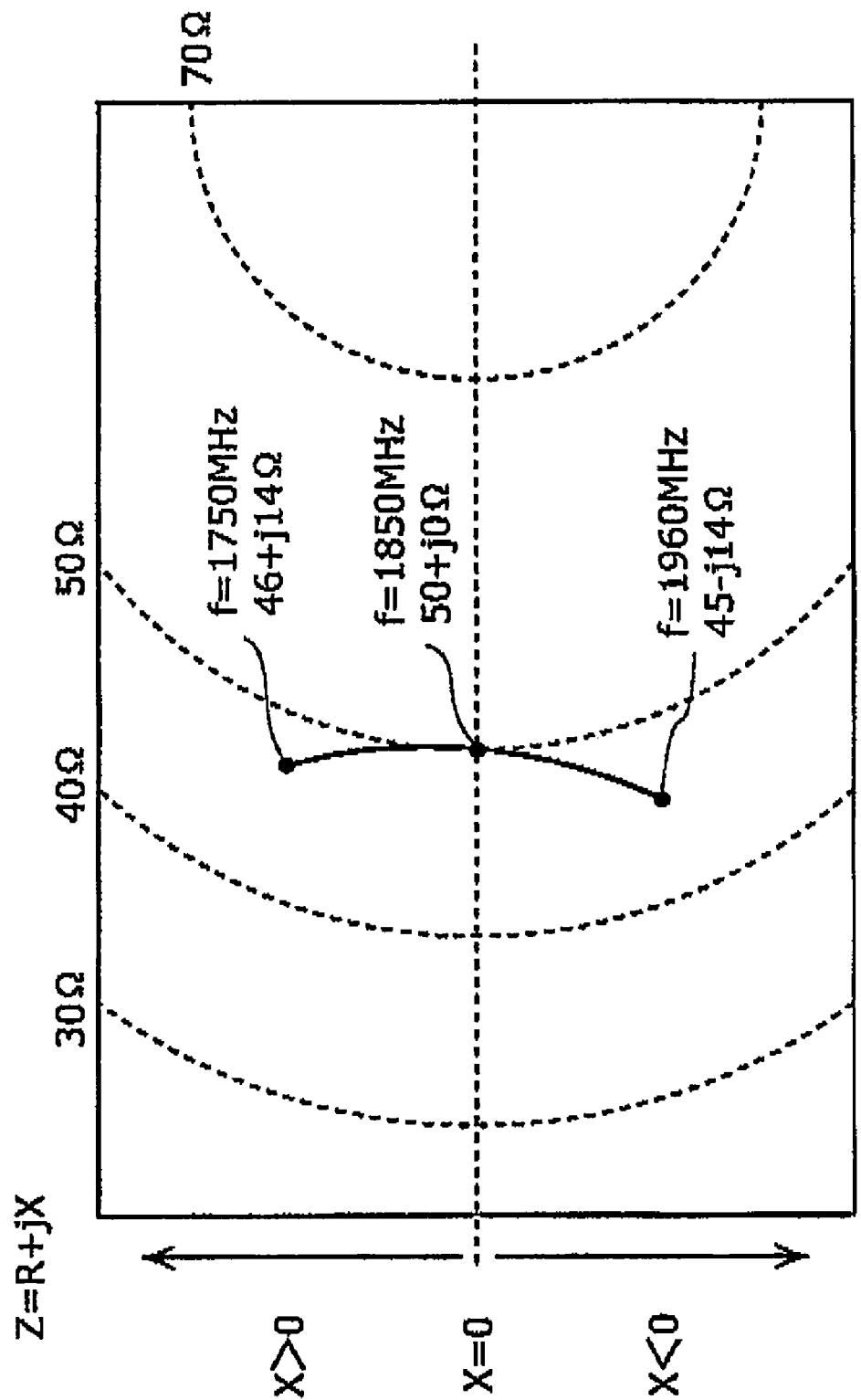
FIG. 22 is a Smith chart showing an input impedance of an isolator according to a fifth embodiment of the present invention.

FIG. 22 is a Smith chart showing an input impedance of an isolator according to the embodiment. As shown in FIG. 22, the isolator of the embodiment is different from the isolator 141 (see FIG. 6) described with reference to FIG. 7 in the Description of the Related Art in that the VSWR is larger in the input terminal 16 in the frequency ranging from 1750 to 1960 MHz. In contrast to the VSWR of 1.5 or below in the conventional isolator, the VSWR in the isolator of the present embodiment is 2 or below and the dispersion of the impedance with respect to frequency expands.

It is assumed that the isolator of the present embodiment is used in stead of the isolator 141 of the first embodiment for the high-frequency power amplifier device 150 (see FIG. 6) of the first embodiment. The values of the serial condenser 12, the shunt inductor 13 and the serial condenser 14 are as same as described in the first embodiment. Here, the degree of the phase rotation performed from the terminal 16 to the terminal 116 is −170 degrees in the frequency of 1850 MHz.

Figure 23:
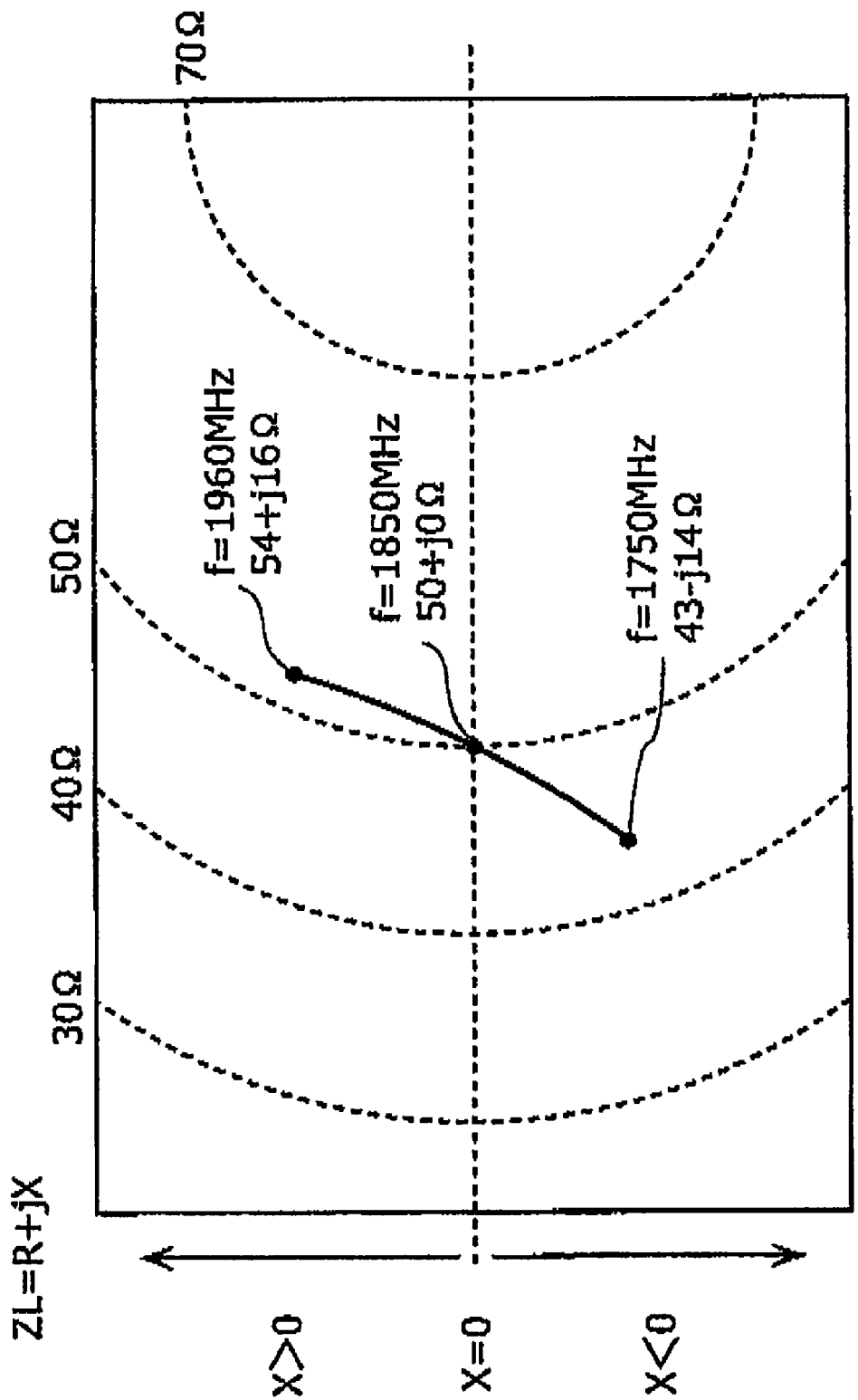
FIG. 23 is a Smith chart showing the impedance ZL (PA) as an impedance of a phase shift circuit viewed from an output terminal of a power amplifier.

FIG. 23 is a Smith chart showing the impedance ZL (PA) as an impedance of a phase shift circuit 11 viewed from the output terminal 16 of the power amplifier 125. As shown in FIG. 23, the impedance ZL (PA) is 43−j14Ω, 50Ω and 54+j16Ω in the frequencies of 1750 MHz, 1850 MHz and 1960 MHz, respectively.

Figure 24:
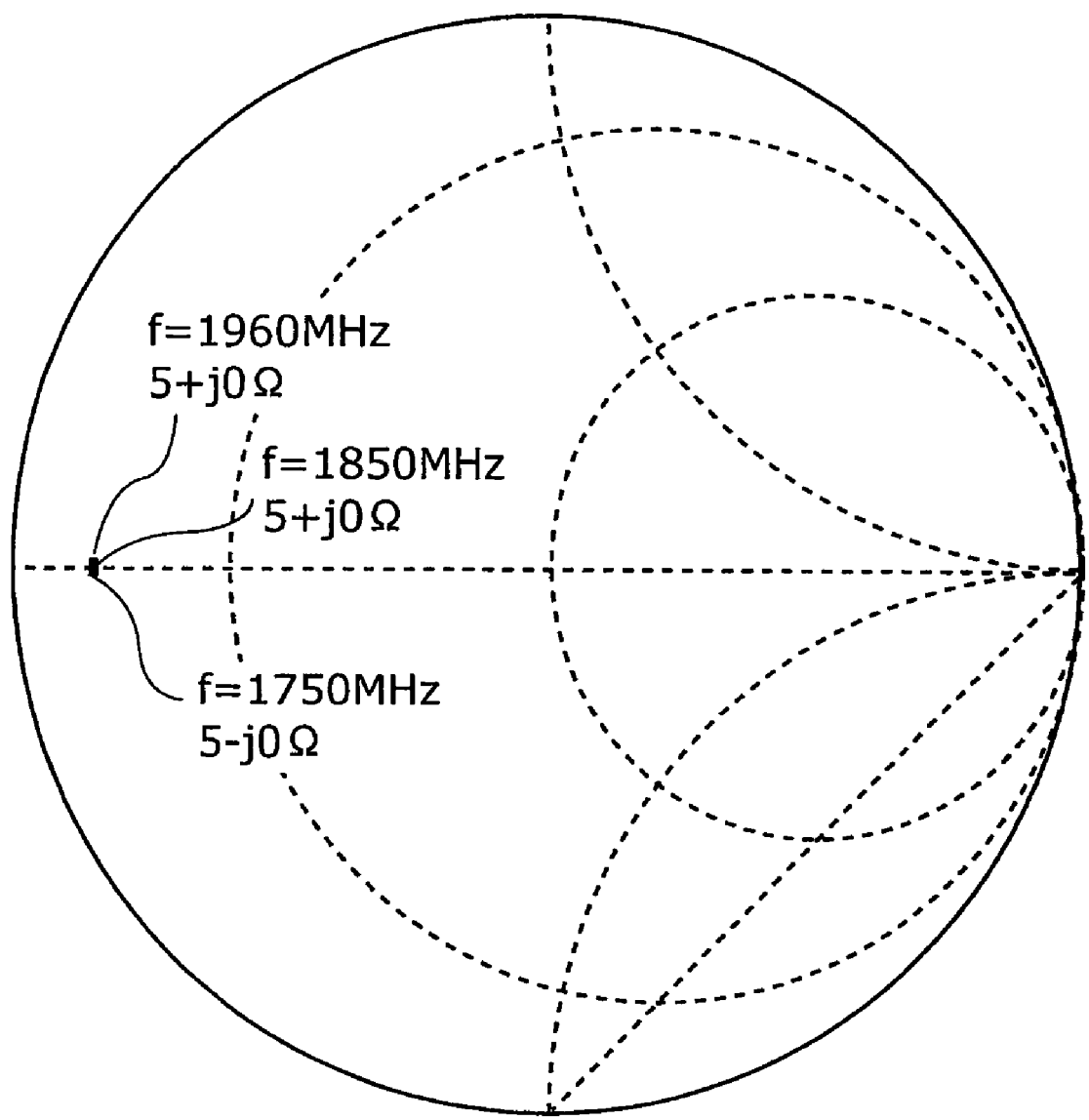
FIG. 24 is a Smith chart showing the impedance ZL (TR) as an impedance of an output matching circuit viewed from an output end of a rear stage HBT.

FIG. 24 is a Smith chart showing the impedance ZL (TR) as an impedance of the output matching circuit 105 viewed from the output end of the rear stage HBT 102. As shown in FIG. 24, the impedance ZL (TR) is just 5Ω in the frequencies of 1750 MHz, 1850 MHz and 1960 MHz, respectively. When Z0=5Ω is standardized, the VSWR in the terminal 126 is 1 that is the smallest value in the frequency ranging from 1750 to 1960 MHz.

FIG. 25 is a diagram showing a table listing the characteristics of the high-frequency power amplifier device according to the embodiment. As shown in FIG. 25, the power amplifier 125 was evaluated, as an example, under the loaded conditions such as a power voltage of 3.5V and an output power of 27 dBm. As a result, it is possible to realize ACPR characteristic of −42 dBc and efficiency of 45% in all the frequencies ranging from 1750 to 1960 MHz owing to the disappearance of the frequency dispersion of the impedance ZL (PA).

Sixth Embodiment

The following describes the sixth embodiment of the present invention with reference to the drawings.

Figure 26:
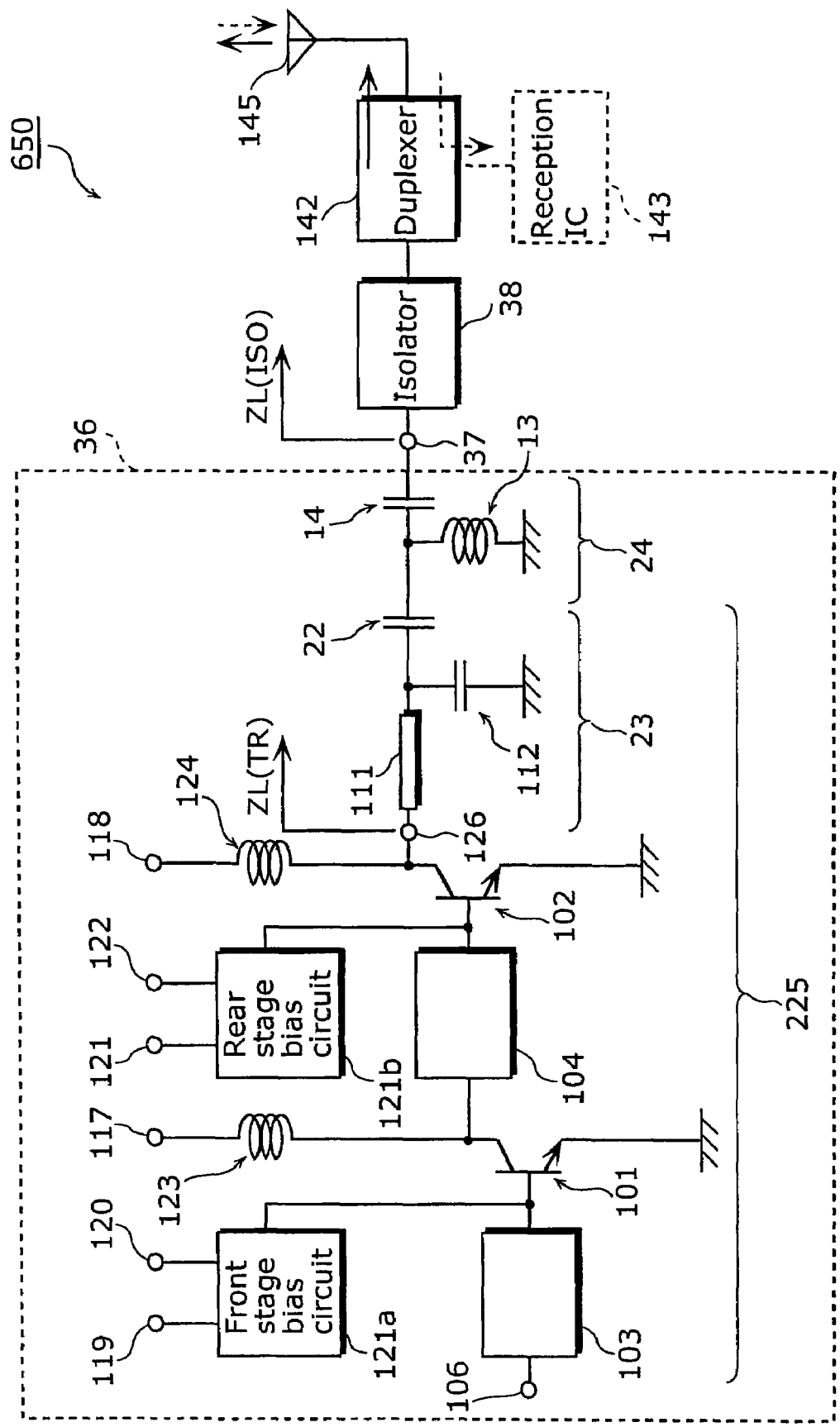
FIG. 26 is a diagram showing an outline of the high-frequency power amplifier device according to a sixth embodiment of the present invention.

FIG. 26 is a diagram showing an outline of the high-frequency power amplifier device according to the embodiment. As shown in FIG. 26, a high-frequency power amplifier device 650 of the present embodiment differs from the high-frequency power amplifier device 250 (see FIG. 17) of the second embodiment in that a power amplifier 36 may include the output matching circuit 23, or both the output matching circuit 23 and the phase shift circuit 24. More specifically, a chip forming a GaAs HBT, the output matching circuit 23 and the phase shift circuit 24 are implemented on the same substrate or in the same package. The Smith chart showing the impedance ZL (Iso) from the isolator 38 in an output terminal 37 of the power amplifier 36 is as same as the one shown in FIG. 22.

Owing to the present embodiment, there is no need to separately design a power amplifier and a phase shift circuit in the development of a cell phone, and thus enables easy development. Also, there is no need to separately implement a power amplifier and a phase shift circuit in the manufacturing process. It is therefore possible to reduce the number of components to be implemented.

Note that with the high-frequency power amplifier device 650 of the present embodiment, the same effects can be obtained as those achieved by the high-frequency power amplifier device 250 of the second embodiment.

Seventh Embodiment

The following describes the seventh embodiment of the present invention with reference to the drawings.

Figure 27:
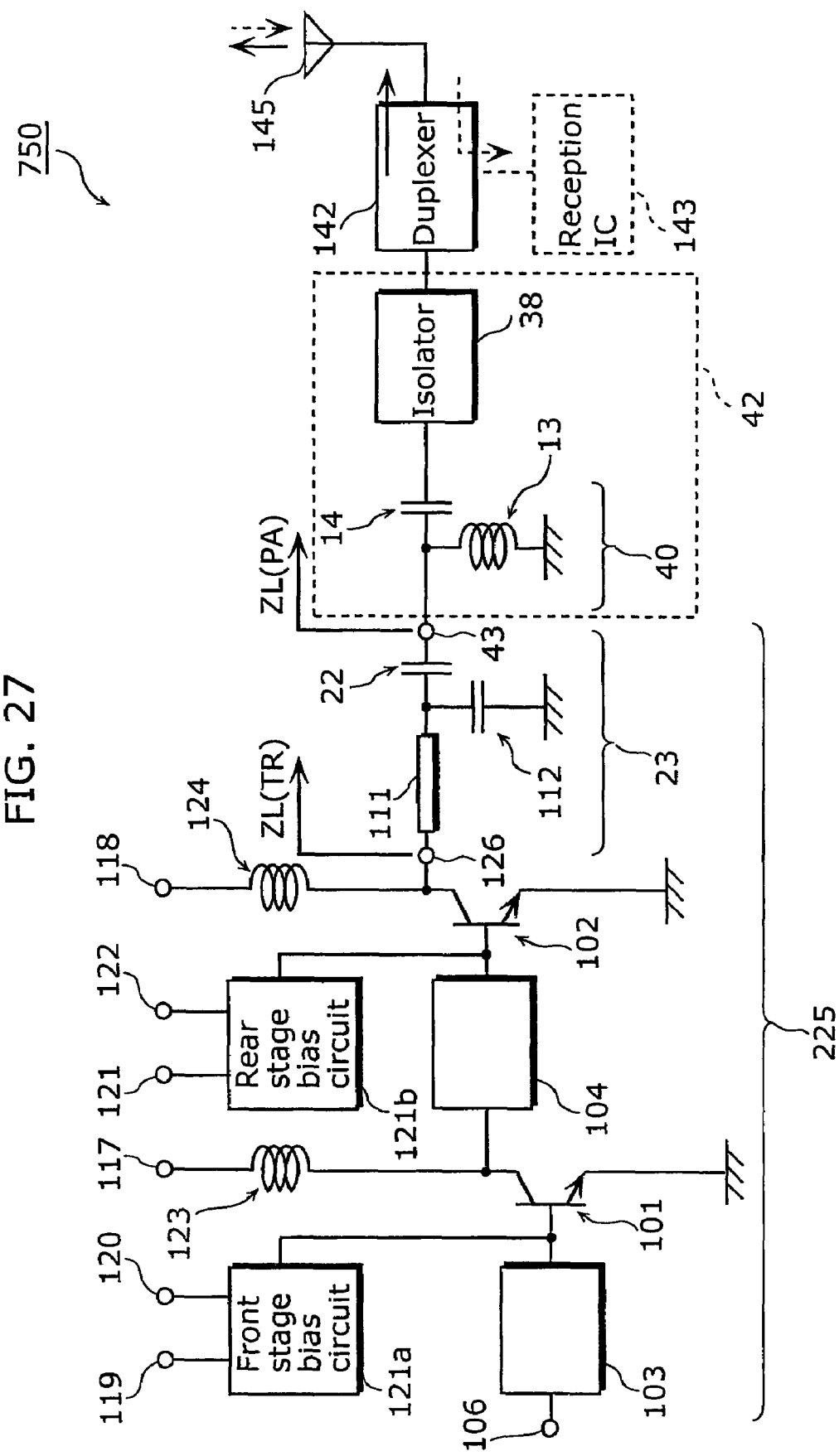
FIG. 27 is a diagram showing an outline of the high-frequency power amplifier device according to a seventh embodiment of the present invention.

FIG. 27 is a diagram showing an outline of the high-frequency power amplifier device according to the embodiment. As shown in FIG. 27, a high-frequency power amplifier 750 of the present embodiment is different from the high-frequency power amplifier 250 (see FIG. 17) of the second embodiment in that an isolator 38 and a phase shift circuit 40 are formed in an isolator unit 42. More specifically, the isolator 38 and the phase shift circuit 40 are implemented on the same substrate or in the same package. The Smith chart showing the impedance ZL (PA) from the isolator unit 42 in an output terminal 43 of the power amplifier 225 is as same as the one shown in FIG. 23.

With the high-frequency power amplifier device 750 of the present embodiment, it is possible to obtain the same effects as those achieved by the high-frequency power amplifier device 250 of the second embodiment, and at the same time to reduce the number of components to be implemented in a cell phone.

Moreover, by applying the characteristics indicated in FIG. 11 or FIG. 22 to the impedance characteristics of the isolator 38 per se, even without the phase shift circuit 40, it is possible to realize a high-frequency power amplifier with excellent broad bandwidth performance.

As has been described above, an example of improving the characteristics using an isolator is shown in each of the embodiments. It is, however, possible to obtain the same effects even without an isolator. For example, even when the high-frequency power amplifier device 150 shown in FIG. 10 is not provided with the isolator 141, by controlling the impedance of the duplexer 142 by the phase shift circuit 11 in the same manner, it is possible to obtain the same effects as those achieved by the high-frequency power amplifier device with an isolator.

Furthermore, the shared use of the power amplifier both in the bands of a 1.7 GHz band and a 1.9 GHz band is examined in the above first through seventh embodiments, however, these embodiments also apply to the shared use of the power amplifier both in the bands of a 800 MHz band and a 900 MHz band.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is useful as a high-frequency power amplifier device to be used for the transmissions carried out by a mobile communication device such as a cell phone, and is especially useful as a high-frequency power amplifier device which has a satisfactory adjacent channel leakage power and power efficiency.

What is claimed is:

1. A high-frequency power amplifier device comprising:
   a power amplifier transistor which amplifies a high-frequency signal;
   an output matching circuit connected to an output side of said power amplifier transistor;
   an impedance conversion circuit connected to an output side of said output matching circuit; and
   a high-frequency element connected to an output side of said impedance conversion circuit,
   wherein said high-frequency power amplifier device is designed so that X[f] satisfies X[L]<X[H], where j denotes an imaginary number, f denotes a frequency, an impedance of said high-frequency element viewed from an output terminal of said output matching circuit is defined as $Z[f]=R[f]+jX[f]$, L denotes a lower limit of the frequency, and H denotes an upper limit of the frequency, $\Delta f/fM$ is 0.05 or above, where $\Delta f$ denotes a frequency bandwidth of said high-frequency power amplifier device and fM denotes a center value of the frequency, and said impedance conversion circuit is set so that a voltage standing wave ratio (VSWR) standardized by an impedance of the output side of said power amplifier transistor is smaller than a VSWR of an impedance of the output side of said impedance conversion circuit viewed from an output terminal of said impedance conversion circuit, the impedance of the output side of said power amplifier transistor being viewed from an output terminal of said power amplifier transistor and corresponding to a center value of an impedance of the frequency.

2. The high-frequency power amplifier device according to claim 1,
wherein said high-frequency power amplifier device is designed so that $X[f]$ satisfies $X[L]<X[M]<X[H]$, where M denotes a center value of the frequency.

3. The high-frequency power amplifier device according to claim 1,
wherein said high-frequency power amplifier device is designed so that $R[f]$ satisfies $R[L]<R[H]$.

4. The high-frequency power amplifier device according to claim 1,
wherein $X[L]$ is a negative value and $X[H]$ is a positive value.

5. The high-frequency power amplifier device according to claim 1,
wherein said high-frequency power amplifier device is designed so that a voltage standing wave ratio at an output end of said power amplifier transistor is less than a voltage standing wave ratio at an output end of said output matching circuit.

6. The high-frequency power amplifier device according to claim 1,
wherein said high-frequency element is an isolator which transmits high-frequency power only to an output side of said isolator.

7. The high-frequency power amplifier device according to claim 1,
wherein said high-frequency power amplifier device is designed so that $X1[f]$ satisfies $X1[L]>X1[H]$, where an impedance of said impedance conversion circuit viewed from output terminal is defined as $Z1[f]=R1[f]+jX1[f]$.

8. The high-frequency power amplifier device according to claim 1,
wherein said high-frequency power amplifier device is designed so that the impedance at an output end of said impedance conversion circuit results from rotating an impedance at an output end of said power amplifier transistor by −90 degrees or less, or 90 degrees or more at a center value of the frequency.

9. The high-frequency power amplifier device according to claim 1,
wherein in said high-frequency power amplifier device, said power amplifier transistor, said output matching circuit and said impedance conversion circuit are included in a same package.

10. The high-frequency power amplifier device according to claim 1,
wherein said phase-shift impedance conversion circuit is comprises a capacitor connected in series to a signal line, and an inductor connected between the signal line and a ground.

11. The high-frequency power amplifier device according to claim 1,
wherein said impedance conversion circuit comprises an inductor connected in series to a signal line, and a capacitor connected between the signal line and a ground.

12. The high-frequency power amplifier device according to claim 1,
wherein said high-frequency element comprises an impedance conversion circuit, connected to the output side of said output matching circuit, which shifts a phase to a predetermined value, and an isolator, connected to the output side of said impedance conversion circuit, which transmits high-frequency power only to an output side of said isolator.

13. The high-frequency power amplifier device according to claim 12,
wherein said high-frequency power amplifier device is designed so that $X1[f]$ satisfies $X1[L]>X1[H]$, where an impedance of said isolator viewed from said impedance conversion circuit is defined as $Z1[f]=R1[f]+jX1[f]$.

14. The high-frequency power amplifier device according to claim 12,
wherein in said high-frequency power amplifier device, said impedance conversion circuit and said isolator are configured in a same package.

15. The high-frequency power amplifier device according to claim 12,
wherein said high-frequency power amplifier device is designed so that a 1.7 GHz band and a 1.9 GHz band are included in a frequency bandwidth.

16. The high-frequency power amplifier device according to claim 12,
wherein said high-frequency power amplifier device is designed so that a 800 MHz band and a 900 MHz band are included in a frequency bandwidth.

* * * * *